(12) United States Patent
Hsu et al.

(10) Patent No.: US 12,446,323 B2
(45) Date of Patent: Oct. 14, 2025

(54) SEMICONDUCTOR ELECTROSTATIC DISCHARGE PROTECTION DEVICE

(71) Applicant: TAIWAN SEMICONDUCTOR MANUFACTURING COMPANY LTD., Hsinchu (TW)

(72) Inventors: Sheng-Fu Hsu, Hsinchu (TW); Chen-Yi Lee, Keelung (TW); Lin-Yu Huang, Hsinchu (TW); Shih-Fan Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 473 days.

(21) Appl. No.: 18/152,146

(22) Filed: Jan. 9, 2023

(65) Prior Publication Data

US 2024/0234410 A1 Jul. 11, 2024

(51) Int. Cl.
*H10D 84/85* (2025.01)
*H10D 89/60* (2025.01)

(52) U.S. Cl.
CPC ........... *H10D 89/811* (2025.01); *H10D 84/85* (2025.01)

(58) Field of Classification Search
None
See application file for complete search history.

(56) References Cited

U.S. PATENT DOCUMENTS

| | | | | |
|---|---|---|---|---|
| 5,451,799 A | * | 9/1995 | Kurimoto | H10D 89/811 257/241 |
| 5,789,791 A | * | 8/1998 | Bergemont | H01L 23/4824 257/920 |
| 6,501,136 B1 | * | 12/2002 | Lin | H10D 64/519 257/E29.136 |
| 2006/0097330 A1 | * | 5/2006 | Yu | H01L 21/76816 257/401 |
| 2017/0110446 A1 | * | 4/2017 | Huang | H10D 30/6211 |
| 2017/0194315 A1 | * | 7/2017 | Huang | H10D 64/517 |
| 2017/0309613 A1 | * | 10/2017 | Chao | H10D 89/60 |
| 2019/0006348 A1 | * | 1/2019 | Huang | H10D 89/711 |

* cited by examiner

*Primary Examiner* — Bilkis Jahan
(74) *Attorney, Agent, or Firm* — WPAT LAW; Anthony King

(57) ABSTRACT

A semiconductor ESD protection device includes a pair of source regions, a pair of gate structures, a drain region, a plurality of first conductive contacts, a plurality of second conductive contacts, a plurality of third conductive contacts, and a dummy structure. The pair of gate structures are disposed between the pair of source regions and extend along a direction. The drain region is disposed between the pair of gate structures. Each of the first conductive contacts is disposed on one of the pair of source regions and is arranged along the direction. Each of the plurality of second conductive contacts is disposed on one of the pair of gate structures. The plurality of third conductive contacts are disposed on the drain region and arranged along the direction. The dummy structure is disposed over the drain region and between the gate structures and between the third conductive contacts.

20 Claims, 27 Drawing Sheets

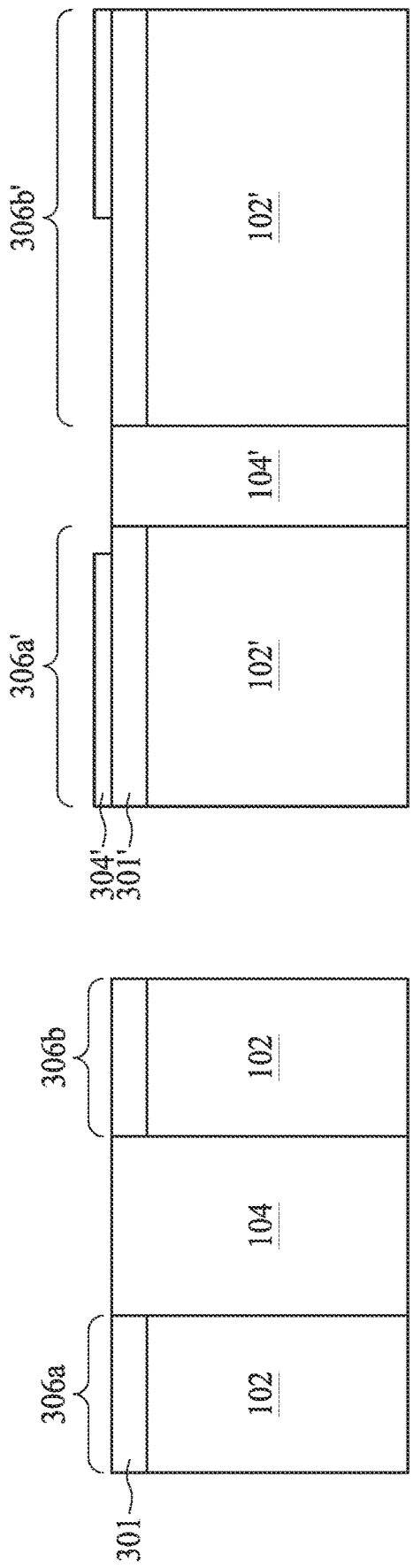

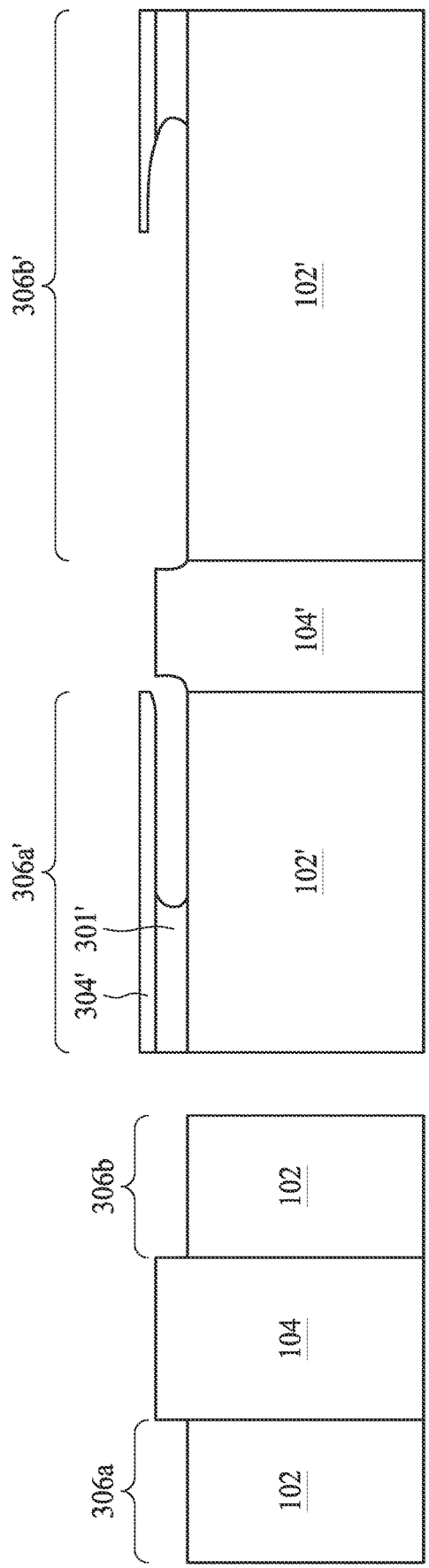

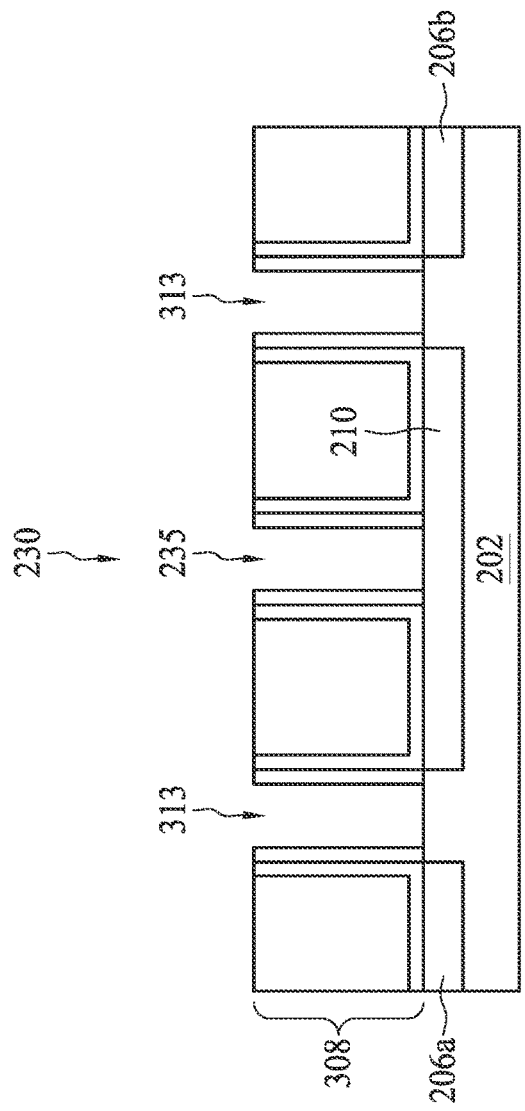
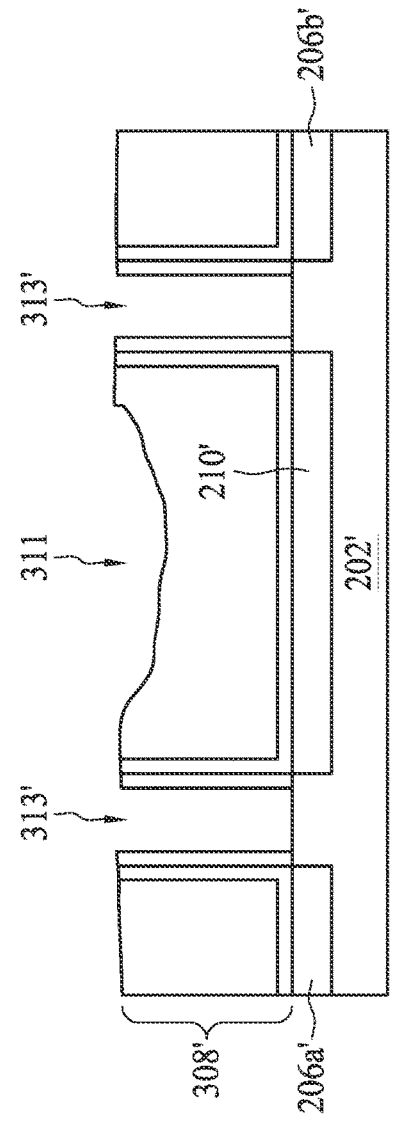
FIG. 26A
FIG. 26B

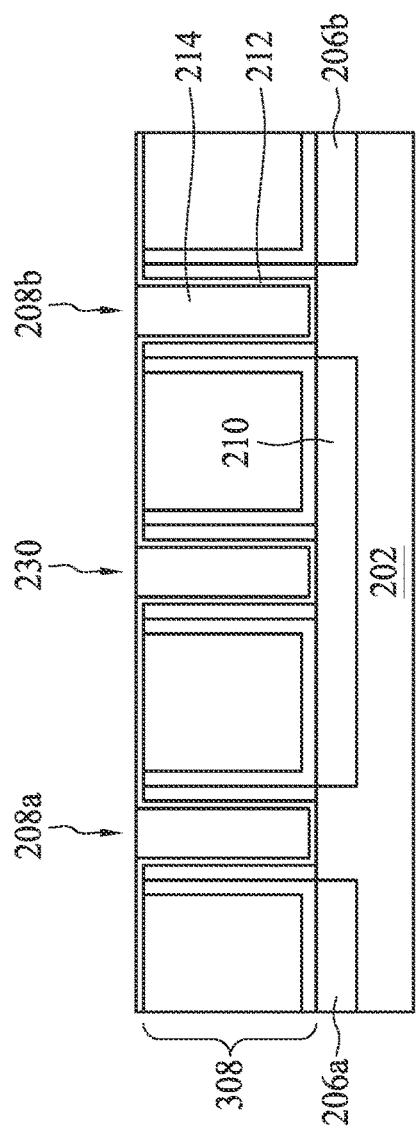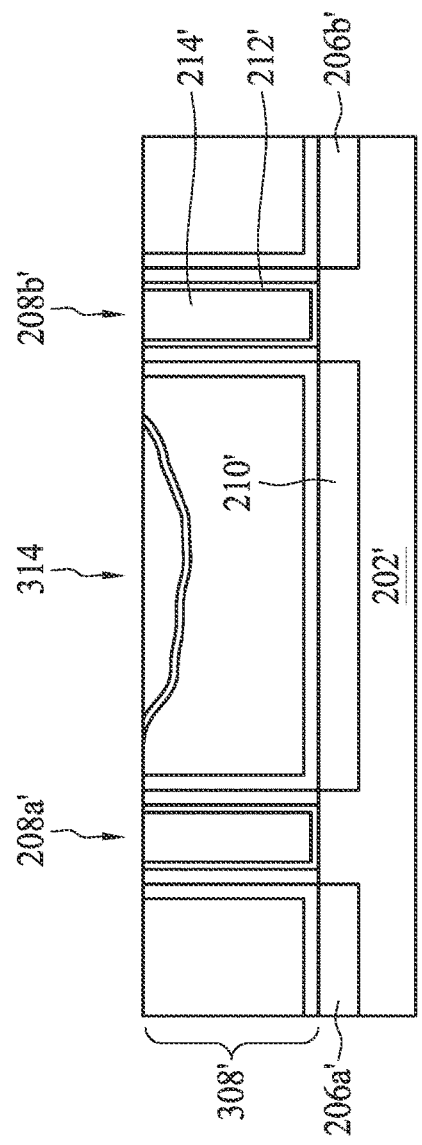

SEMICONDUCTOR ELECTROSTATIC DISCHARGE PROTECTION DEVICE

BACKGROUND

In a semiconductor integrated circuit (IC), electrostatic discharge (ESD) may result in damage to a semiconductor device. To prevent such damages, protection circuits are provided in the ICs for rendering a safe discharge path. The protection circuit is basically a switch which is off during normal circuit operation and turns on during an ESD event, when a high voltage is present. Accordingly, ESD protection is an important issue for protection of the ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20, 21, 22A and 23A are schematic drawings illustrating various stages for forming a semiconductor ESD protection device according to aspects of the present disclosure.

FIGS. 22B and 23B are comparisons to FIGS. 22A and 22B, respectively.

FIGS. 24, 25A, 26A, 27A and 28A are schematic drawings illustrating various stages for forming a semiconductor ESD protection device according to aspects of the present disclosure.

FIGS. 25B, 26B, 27B and 28B are comparisons to FIGS. 25A, 26A, 27A and 28A, respectively.

DETAILED DESCRIPTION

Figure 1:
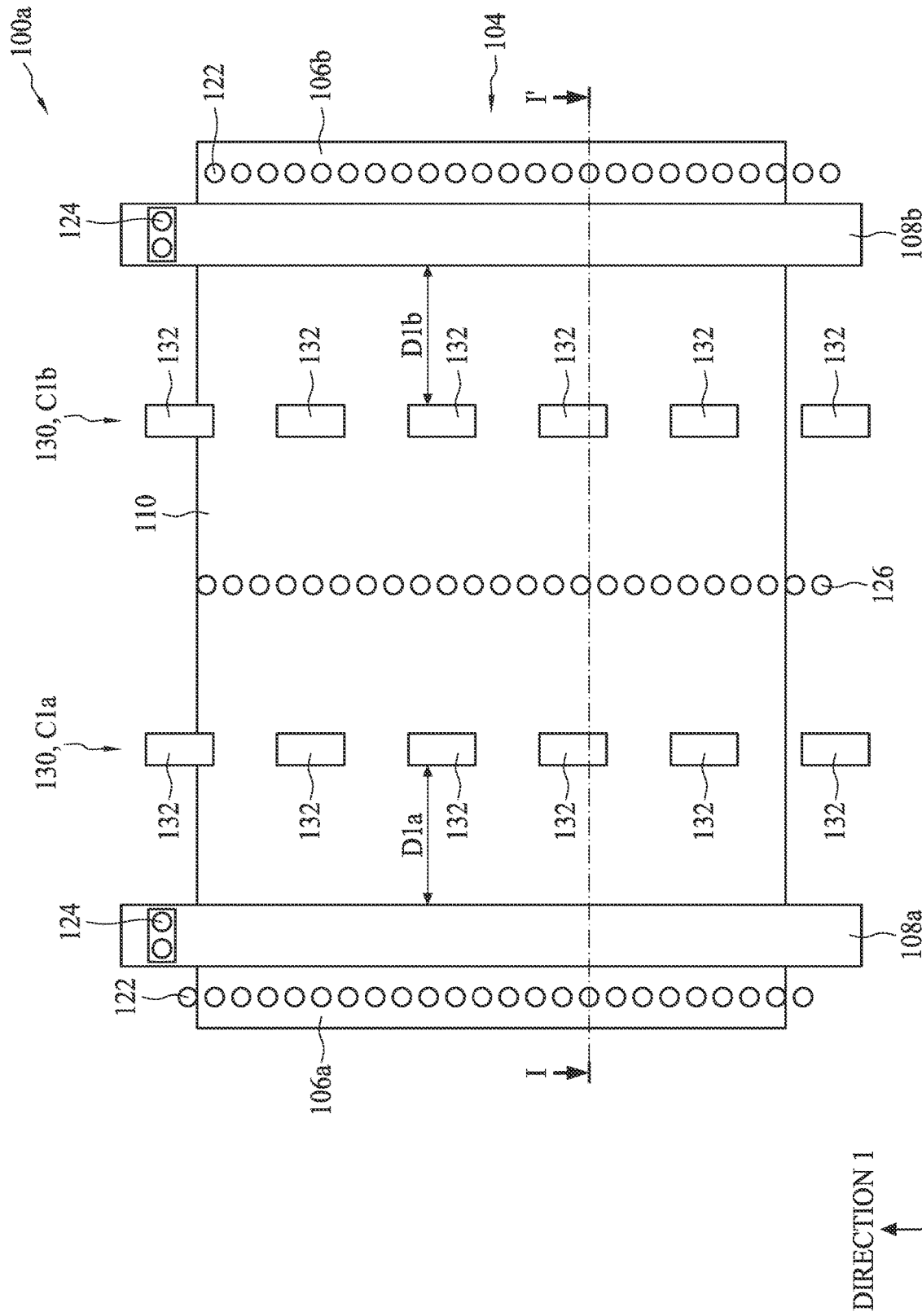
FIG. 1 shows an overhead layout diagram of a semiconductor ESD protection device in accordance with aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Metal oxide semiconductor (MOS) devices, such as ground-gate n-type MOS devices (GGnMOS) in multi-finger configuration, have been widely used as ESD protection devices. In a multi-finger ESD protection device, sources and drains are implemented in a series of parallel-extending, alternatively-patterned features. Each of the finger structures inherently constitutes a BJT that is capable of providing a releasing path for an ESD transient when triggered on. Further, the drains of the ESD protection device are often made to have an area larger than those of the sources to avoid device breakdown during ESD events.

However, such greater area of the drains raise issues. In some comparative approaches, dishing issues arise during planarization and thus unwanted materials may remain. For example, after a planarization for forming a metal gate structure in a replacement poly gate (RPG) process, high-k materials and metal materials may be left over an inter-layer dielectric (ILD) structure due to the dishing issue. In some comparative approaches, a hard mask may remain over a substrate after a planarization for forming isolation structures due to the dishing issue. The dishing issue and the subsequent residue issue may lead to reduced performance of a multi-finger ESD protection device.

According to one embodiment of the present disclosure, a semiconductor ESD protection device that is able to mitigate the dishing issue is provided. In some embodiments, the semiconductor ESD protection device includes one or more dummy structures over the drain.

The dummy structure helps provide mechanical strength during planarization, thereby mitigating the dishing issue. Additionally, in some embodiments, the provided semiconductor ESD protection device may be a planar device. In some embodiments, the provided semiconductor ESD protection device may a non-planar device.

Figure 13:
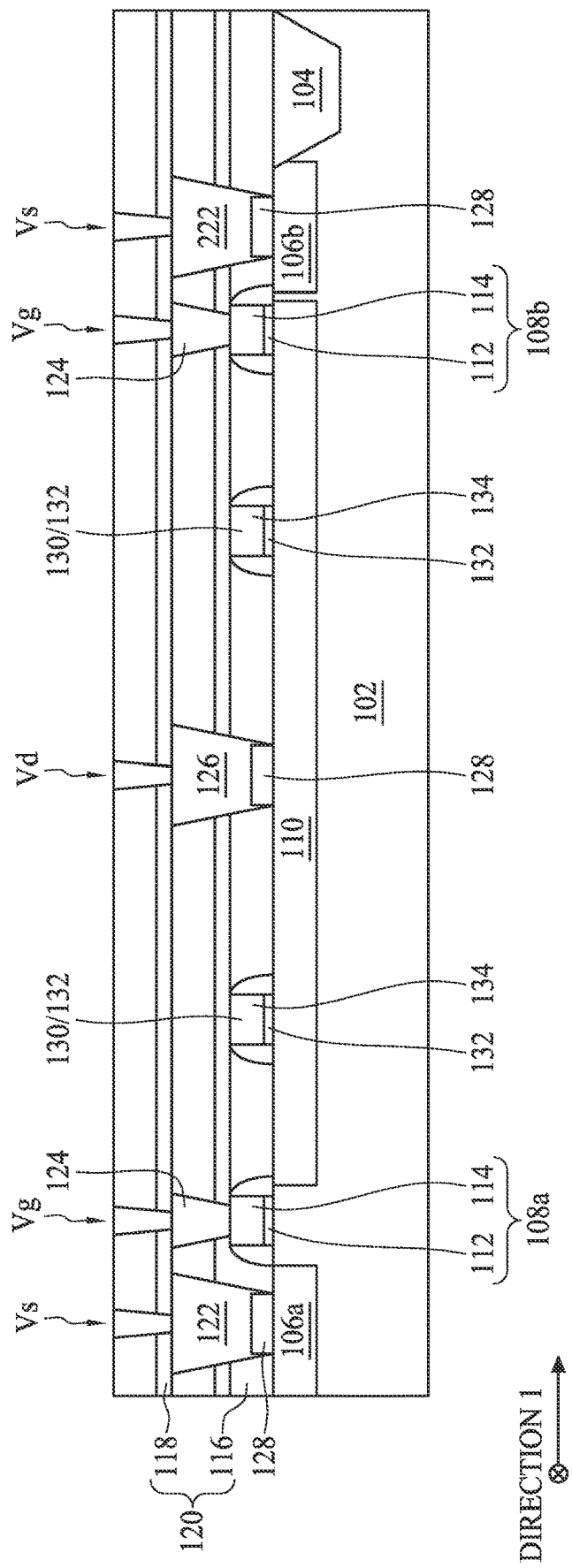
FIG. 13 is a cross-sectional view taken along lines I-I' of FIG. 1 according to aspects of the present disclosure.

Please refer to FIGS. 1 and 13, wherein FIG. 1 is an overhead layout diagram of a semiconductor ESD protection device 100a in accordance with aspects of the present disclosure, and FIG. 13 is a cross-sectional view taken along line I-I' of FIG. 1. The semiconductor ESD protection device 100a includes a substrate 102 (shown in FIG. 13). The substrate 102 includes any type of semiconductor body such as monocrystalline silicon/CMOS bulk, germanium (Ge), silicon-germanium (SiGe), gallium arsenide (GaAs), silicon on insulator (SOI), etc. The substrate 102 can be doped with, for example but not limited thereto, n-type or p-type dopants. In other embodiments, the substrate 102 can be undoped (e.g., intrinsic). An isolation structure 104 is formed in the substrate 102. In some embodiments, the isolation structure 104 defines a location and an area of an active region where the semiconductor ESD protection device 100a is formed. The isolation structure 104 may be a shallow trench isolation (STI). In some embodiments, the area of the active region for accommodating the semiconductor ESD protection device 100a may be between approximately 30 $\mu m^2$ and approximately 1,000 $\mu m^2$, but the disclosure is not limited thereto. In some embodiments, a width of the isolation structure 104 may between approximately 0.1 μm and approximately 10 μm, but the disclosure is not limited thereto.

The semiconductor ESD protection device 100a includes a pair of source regions 106a and 106b disposed in the substrate 102, a pair of gate structures 108a and 108b disposed over the substrate 102, and a drain region 110 disposed in the substrate 102. As shown in FIGS. 1 and 13, the pair of gate structures 108a and 108b are disposed between the pair of source regions 106a and 106b, and the drain region 110 is disposed between the pair of gate structures 108a and 108b. Further, the pair of gate structures 108a and 108b extend along a direction 1. In some embodiments, an area of the drain region 110 is greater than an area of each source region 106a, 106b. In some embodiments, the pair of gate structures 108a and 108b share the drain region 110. Accordingly, the source region 106a, the drain region 110 and the source region 106b are alternately arranged along a direction 2 to form a multi-finger semiconductor ESD protection device 100a, as shown in FIG. 1. In some embodiments, the direction 1 and the direction 2 are perpendicular to each other.

The substrate 102 includes dopants of a first conductivity type, and the pair of source regions 106a and 106b and the drain region 110 include a second conductivity type. The first and second conductivity types are complementary to each other. In some embodiments, the first conductivity type is a p type, and the second conductivity type is an n type.

In some embodiments, well regions and/or other doped regions may be formed in the substrate 102, though not shown. The well regions and the doped regions can be formed adjacent to or under the source regions 106a and 106b and/or the drain region 110. The well regions and the doped regions may include dopants of the first conductivity type or the second conductivity type. It should be understood that conductivity type and arrangement of the well regions and the doped regions can be modified depending on different product designs.

The gate structure 108a is between the source region 106a and the drain region 110, and the gate structure 108b is between the source region 106b and the drain region 110. In some embodiments, a width of each gate structure 108a, 108b is between approximately 2 μm and approximately 40 μm, and a length of each gate structure 108a, 108b is between approximately 10 nm and approximately 1,000 nm, but the disclosure is not limited thereto. The pair of gate structures 108a and 108b includes a gate dielectric layer 112, a gate conductive layer 114 and spacers (shown in FIG. 13). In some embodiments, the gate conductive layer 114 includes semiconductor material such as polysilicon. In such embodiments, the gate dielectric layer 112 includes an oxide (e.g., silicon oxide), a nitride (e.g., silicon nitride), or the like. In other embodiments, the gate conductive layer 114 includes metal materials such as work function metal and low-resistant metal. In such embodiments, the gate conductive layer 114 may be a multi-layered structure. Further, in such embodiments, the gate dielectric layer 112 includes high-k dielectric materials such as hafnium oxide (HfO), tantalum oxide (TaO), hafnium silicon oxide (HfSiO), hafnium tantalum oxide (HfTaO), aluminum oxide (AlO), zirconium oxide (ZrO), or the like. In some embodiments, the spacers are made of silicon nitride (SiN), silicon carbide (SiC), silicon oxide (SiO), silicon oxynitride (SiON), silicon carbide or any other suitable material, but the disclosure is not limited thereto.

In some embodiments, the semiconductor ESD device 100a includes a dielectric layer 116 and a dielectric layer 118 (shown in FIG. 13) disposed over the substrate 102. In some embodiments, the dielectric layers 116 and 118 may be alternately arranged, as shown in FIG. 13, but the disclosure is not limited thereto. The dielectric layers 116 and 118 may include dielectric materials having different etching rates, but the disclosure is not limited thereto. In some embodiments, the dielectric layers 116 and 118 form a dielectric structure 120 over the substrate 102. As shown in FIG. 13, the dielectric structure 120 is disposed over the pair of source regions 106a and 106b, the pair of gate structures 108a and 108b and the drain region 110.

The semiconductor ESD protection device 100a further includes a plurality of conductive contacts 122, 124, and 126 disposed in the dielectric structure 120. The conductive contacts 122, 124 and 126 may be or include, for example but not limited thereto, tungsten (W), copper (Cu), aluminum (Al), some other conductive material, or a combination of thereof.

In some embodiments, each of the conductive contacts 122 is disposed on one of the pair of source regions 106a and 106b and arranged along the direction 1. Further, the conductive contacts 122 are electrically connected to the source regions 106a and 106b. In some embodiments, each of the conductive contacts 124 is disposed on one of the pair of gate structures 108a and 108b. Further, the conductive contacts 124 are electrically connected to the gate structures 108a and 108b. In some embodiments, the conductive contacts 126 are disposed on the drain region 110 and electrically connected to the drain region 110. Further, the conductive contacts 126 are arranged along the direction 1 to form a column, as shown in FIG. 1. In some embodiments, salicide structures 128 can be formed between the conductive contacts 122 and the source regions 106a, 106b, and between the conductive contact 126 and the drain region 110, as shown in FIG. 13.

In some embodiments, the semiconductor ESD protection device 100a further includes a dummy structure 130 disposed over the drain region 110. As shown in FIG. 1, in some embodiments, the dummy structure 130 is disposed between the gate structures 108a and the conductive contacts 126, and between the gate structures 108b and the conductive contacts 126. As shown in FIG. 13, the dummy structure 130 is disposed in the dielectric structure 120. Further, sidewalls and a top surface of the dummy structure 130 are in contact with the dielectric structure 120. In some embodiments, the dummy structure 130 can include a dielectric layer 132, a conductive layer 134 over the dielectric layer 132, and spacers over sidewalls of the conductive layer 134 and the dielectric layer 132. In some embodiments, the conductive layer 132 of the dummy structure 130 and the gate conductive layer 114 of the gate structures 108a and 108b include a same material, such as a metal material. In such embodiments, the dielectric layer 132 of the dummy structure 130 and the gate dielectric layer 112 of the gate structures 108a and 108b include a same material, such as a high-k dielectric material. In some alternative embodiments, the conductive layer 134 of the dummy structure 130 includes materials different from the materials of the gate conductive layer 114 of the gate structure 108a and 108b. For example, the gate conductive layer 114 of the gate structures 108a and 108b includes metal materials, while the conductive layer 134 of the dummy structure 130 includes semiconductor materials. In such embodiments, the dielectric layer 132 of the dummy structure 130 and the gate dielectric layer 112 of the gate structures 108a and 108b may include different dielectric materials.

Referring to FIG. 1, in some embodiments, the dummy structure 130 includes a plurality of dummy islands 132. In some embodiments, a width of each dummy island 132 is between approximately 0.1 μm and approximately 40 μm, and a length of each dummy island 132 is between approximately 5 nm and approximately 1,000 nm, but the disclosure is not limited thereto. Each of the dummy islands 132 is disposed between the gate structure 108a and the conductive contacts 126, or between the gate structure 108b and the conductive contacts 126. Further, the dummy islands 132 are disposed to form columns C1a and C1b extending along the direction 1. As shown in FIG. 1, the column C1a formed by the dummy islands 132 is disposed between the gate structure 108a and the conductive contacts 126, and the column C1b formed by the dummy islands 132 is disposed between the gate structure 108b and the conductive contacts 126. In such embodiments, a distance D1a between the gate structure 108a and the column C1a is equal to a distance D1b between the gate structure 108b and the column C1b. In some embodiments, the distances D1a and D1b are respectively between approximately 20 nm and approximately 8,000 nm, but the disclosure is not limited thereto. In some embodiments, a distance between adjacent dummy islands 132 measured along the direction 1 is between approximately 10 nm and approximately 5,000 nm, but the disclosure is not limited thereto.

Figure 2:
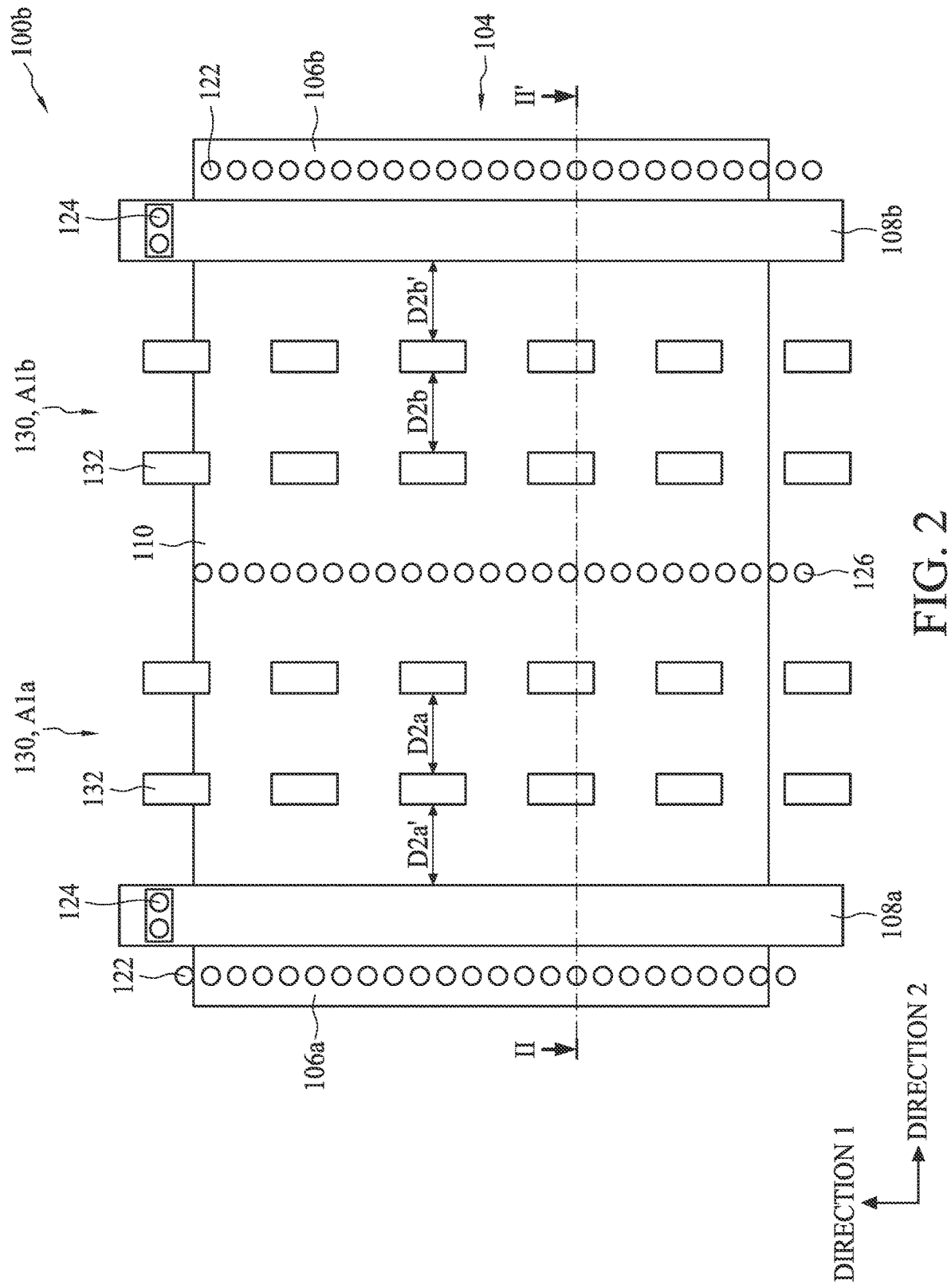
FIG. 2 shows an overhead layout diagram of a semiconductor ESD protection device in accordance with aspects of the present disclosure.

Please refer to FIG. 2, which is an overhead layout diagram of a semiconductor ESD protection device 100b in accordance with aspects of the present disclosure. It should be understood that same elements in FIGS. 1 and 2 are depicted by same numerals, and can include same materials, and thus repeated description may be omitted in the interest of brevity. In some embodiments, the dummy islands 132 are arranged to form column-and-row arrays A1a and A1b. As shown in FIG. 2, the array A1a is disposed between the gate structure 108a and the conductive contacts 126, and the array A1b is disposed between the gate structure 108b and the conductive contacts 126. In some embodiments, a distance D2a between adjacent dummy islands 132 in the array A1a and a distance D2a' between the array A1a and the gate structure 108a are equal, and a distance D2b between adjacent dummy islands 132 in the array A1b and a distance D2b' between the array A1b and the gate structure 108b are equal.

Figure 3:
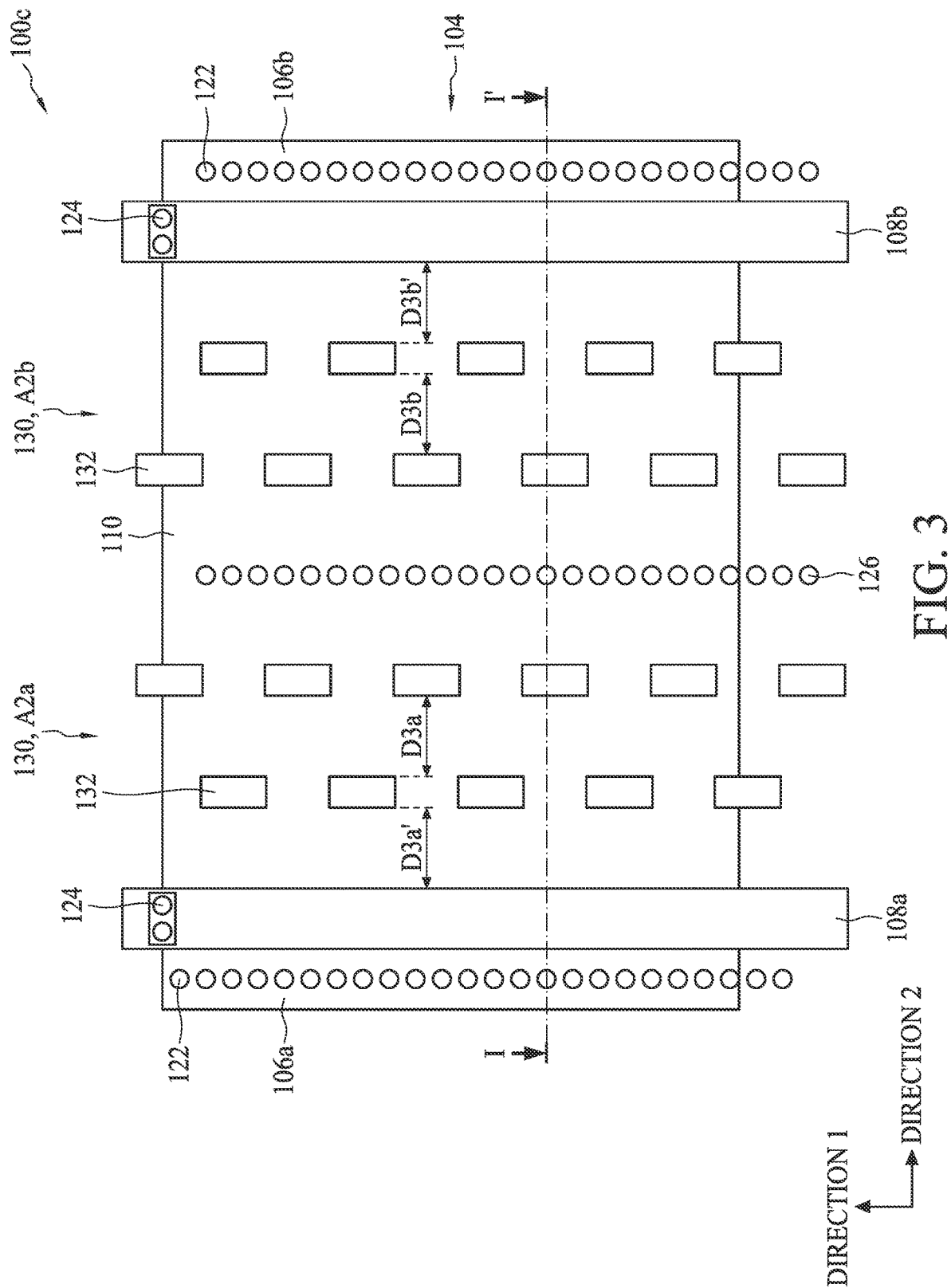
FIG. 3 shows an overhead layout diagram of a semiconductor ESD protection device in accordance with aspects of the present disclosure.

Please refer to FIG. 3, which is an overhead layout diagram of a semiconductor ESD protection device 100c in accordance with aspects of the present disclosure. It should be understood that same elements in FIGS. 1 and 3 are depicted by same numerals, and can include same materials, and thus repeated description may be omitted in the interest of brevity. In some embodiments, the dummy islands 132 are arranged to form staggered arrays A2a and A2b. As shown in FIG. 3, the array A2a is disposed between the gate structure 108a and the conductive contacts 126, and the array A2b is disposed between the gate structure 108b and the conductive contacts 126. In some embodiments, a distance D3a between adjacent dummy islands 132 in the array A2a and a distance D3a' between the array A2a and the gate structure 108a are equal, and a distance D3b between adjacent dummy islands 132 in the array A2b and a distance D3b' between the array A2b and the gate structure 108b are equal.

In some embodiments, the dummy islands 132 can be randomly disposed over the drain region 110. It should be noted that the dummy islands 132 can be arranged to form various patterns, depending on product designs.

Figure 4:
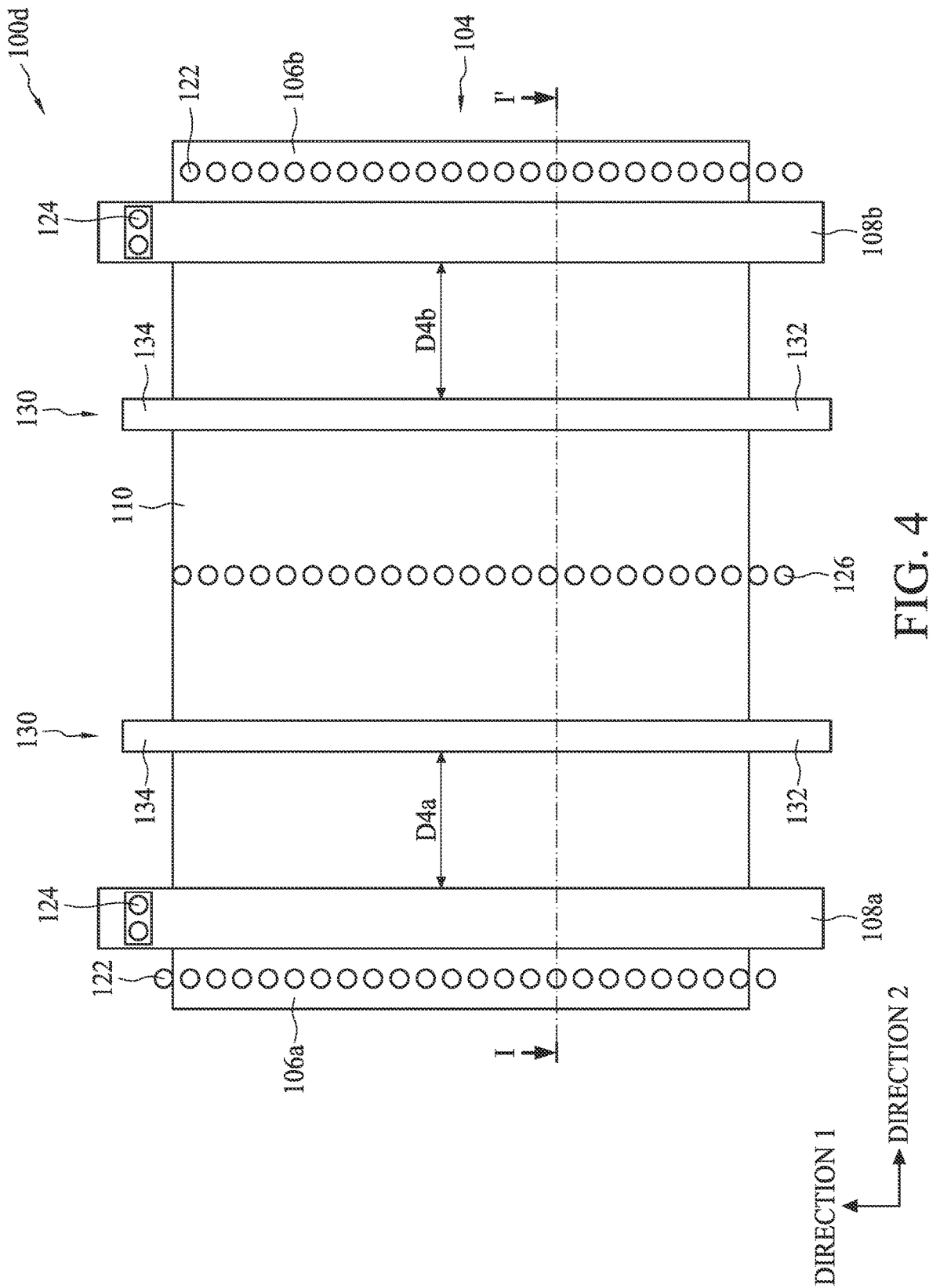
FIG. 4 shows an overhead layout diagram of a semiconductor ESD protection device in accordance with aspects of the present disclosure.

Please refer to FIG. 4, which is an overhead layout diagram of a semiconductor ESD protection device 100d in accordance with aspects of the present disclosure. It should be understood that same elements in FIGS. 1 and 4 are depicted by same numerals, and can include same materials, and thus repeated description may be omitted in the interest of brevity. In some embodiments, the dummy structures 130 includes dummy strips 134 extending along the direction 1. In some embodiments, a width of each dummy strip 134 is between approximately 0.1 μm and approximately 40 μm. In some embodiments, a length of each dummy strip 134 may be equal to or less than a length of the gate structures 108a and 108b. In some embodiments, the length of each dummy strip 134 is between approximately 5 nm and approximately 1,000 nm, but the disclosure is not limited thereto. The dummy strip 134 is disposed between the gate structure 108a and the conductive contacts 126, or between the gate structures 108b and the conductive contacts 126. In such embodiments, a distance D4a between the gate structure 108a and the dummy strip 134 is equal to a distance D4b between the gate structure 108b and the dummy strip 134. In some embodiments, the distances D4a and D4b are respectively between approximately 20 nm and approximately 8,000 nm, but the disclosure is not limited thereto.

Figure 5:
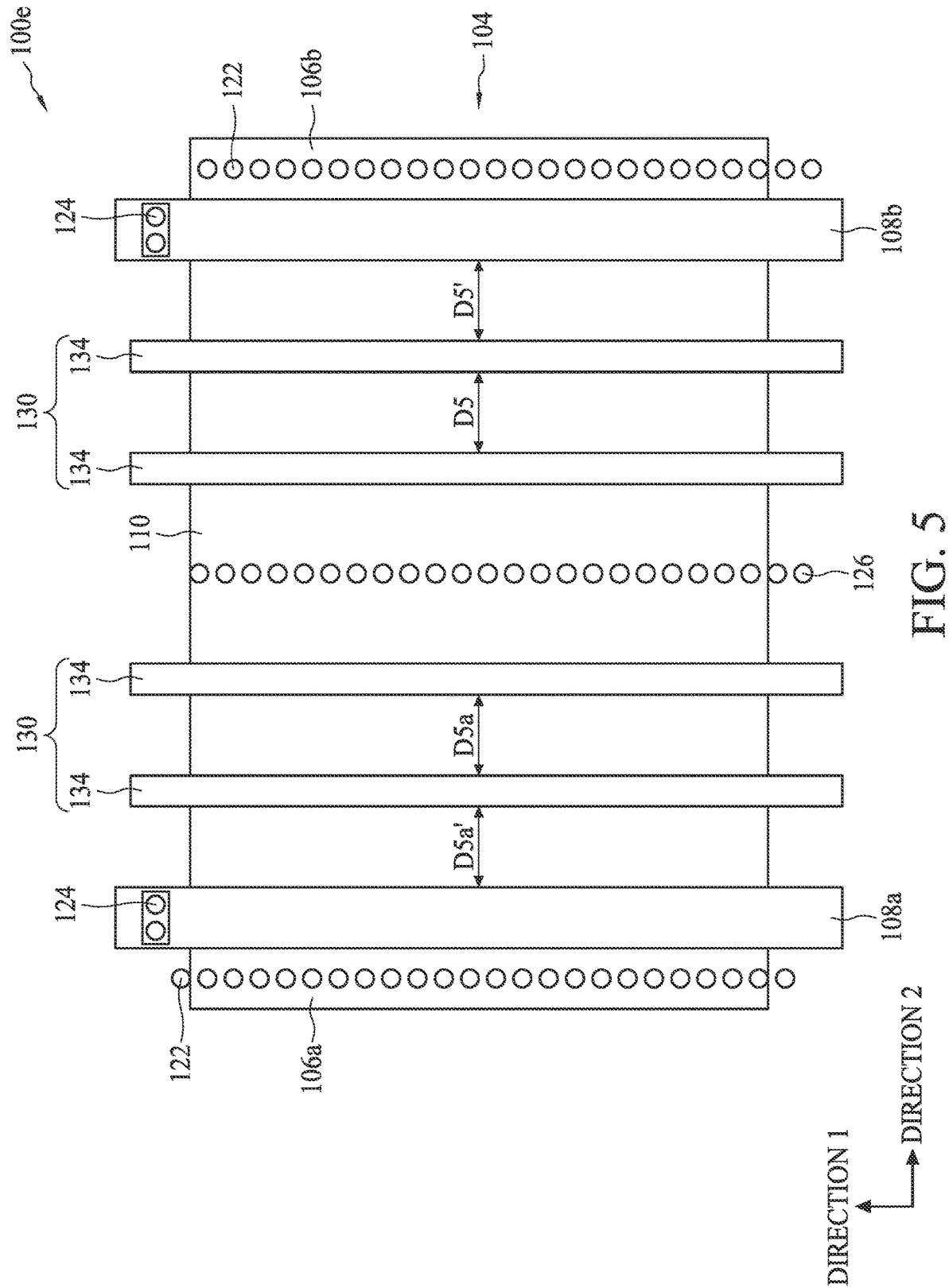
FIG. 5 shows an overhead layout diagram of a semiconductor ESD protection device in accordance with aspects of the present disclosure.

Please refer to FIG. 5, which is an overhead layout diagram of a semiconductor ESD protection device 100e in accordance with aspects of the present disclosure. It should be understood that same elements in FIGS. 1 and 5 are depicted by same numerals, and can include same materials, and thus repeated description may be omitted in the interest of brevity. In some embodiments, the dummy structure 130 includes dummy strips 134 extending along the direction 1. In some embodiments, a width of each dummy strip 134 is between approximately 0.1 μm and approximately 40 μm. In some embodiments, lengths of the dummy strips 134 are equal to the length of the gate structures 108a and 108b, but the disclosure is not limited thereto. In some embodiments, the length of each dummy strip 134 is between approximately 5 nm and approximately 1,000 nm, but the disclosure is not limited thereto. In some embodiments, multiple dummy strips 134 are disposed between the gate structure 108a and the conductive contacts 126, and multiple dummy strips 134 are disposed between the gate structure 108b and the conductive contacts 126. In such embodiments, a distance D5a between the gate structure 108a and the dummy strip 134 is equal to a distance D5a' between adjacent dummy strips 134, and a distance D5b between the gate structure 108b and the dummy strip 134 is equal to a distance D5b' between adjacent dummy strips 134. In some embodiments, the distances D5a and D5b are equal, but the disclosure is not limited thereto.

Figure 6:
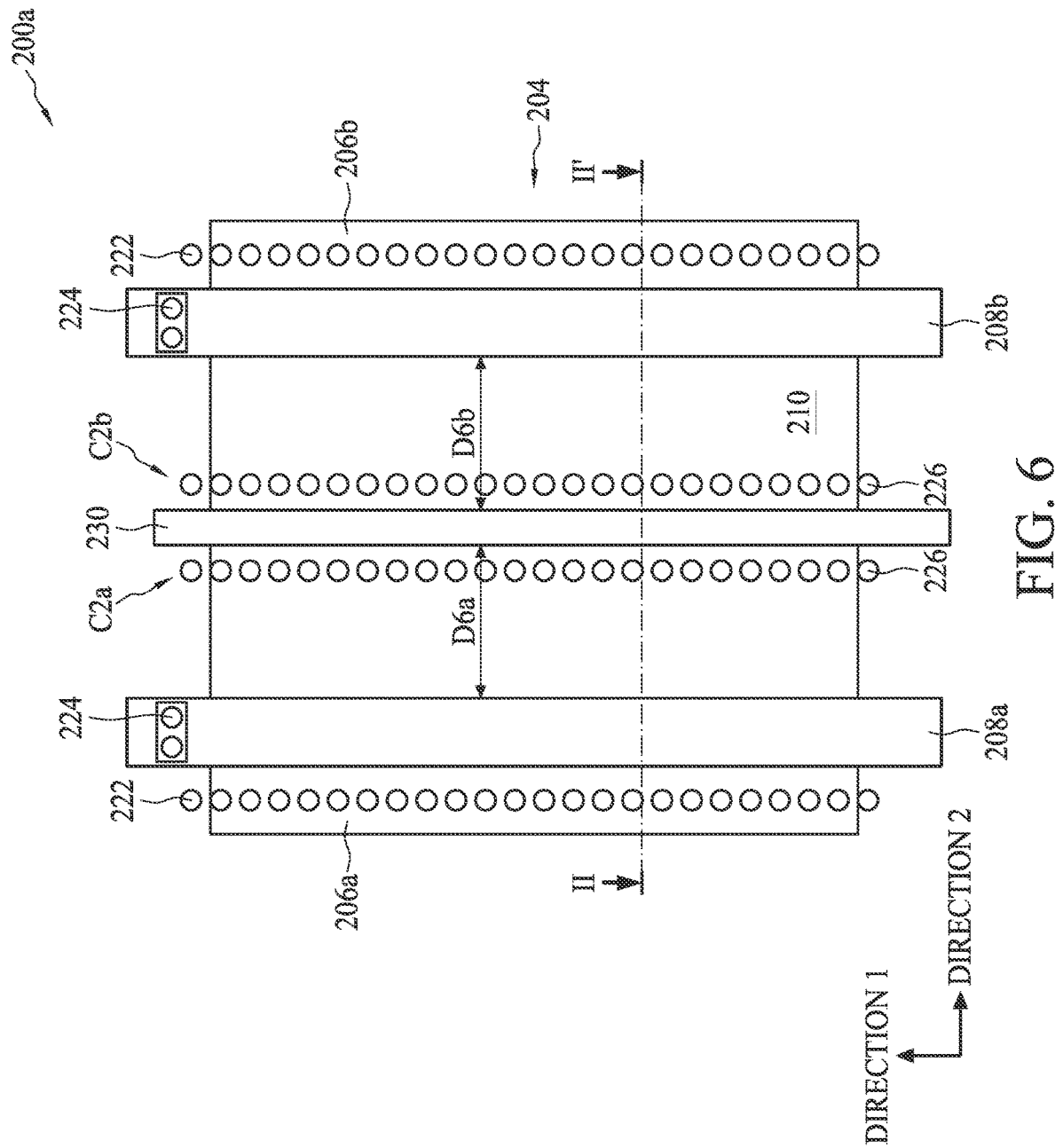
FIG. 6 shows an overhead layout diagram of a semiconductor ESD protection device in accordance with aspects of the present disclosure.
Figure 17:
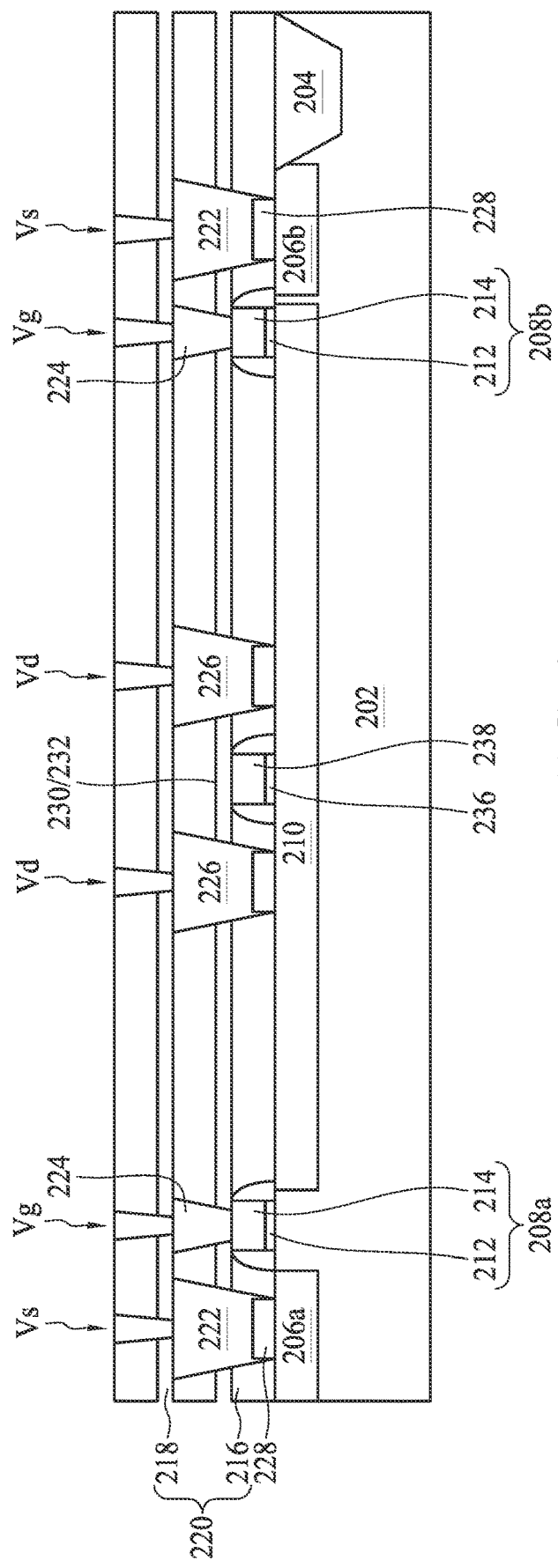
FIG. 17 is a cross-sectional view taken along lines II-II' of FIG. 2 according to aspects of the present disclosure.

Please refer to FIGS. 6 and 17, wherein FIG. 6 shows an overhead layout diagram of a semiconductor ESD protection device 200a in accordance with aspects of the present disclosure, and FIG. 17 is a cross-sectional view take along line II-II' of FIG. 6. It should be understood that same elements in FIGS. 1 and 6 can include same materials, and thus repeated description may be omitted in the interest of brevity. The semiconductor ESD protection device 200a includes a substrate 202 (shown in FIG. 17). The substrate 202 can be doped with, for example but not limited thereto, n-type or p-type dopants. In other embodiments, the substrate 202 can be undoped (e.g., intrinsic). An isolation structure 204 is formed in the substrate 202. In some embodiments, the isolation structure 204 defines a location and an area of an active region where the semiconductor ESD protection device 200a is to be formed. The isolation structure 204 may be an STI. In some embodiments, the area of the active region for accommodating the semiconductor ESD protection device 200a may be between approximately 30 μm$^2$ and approximately 1,000 μm$^2$, but the disclosure is not limited thereto. In some embodiments, a width of the isolation structure 204 may be between approximately 0.1 μm and approximately 10 μm, but the disclosure is not limited thereto.

The semiconductor ESD protection device 200a includes a pair of source regions 206a and 206b disposed in the substrate 202, a pair of gate structure 208a and 208b disposed over the substrate 202, and a drain region 210 disposed in the substrate 202. As shown in FIGS. 6 and 17, the pair of gate structure 208a and 208b are disposed between the pair of source regions 206a and 206b, and the drain region 210 is disposed between the pair of gate structures 208a and 208b. Further, the pair of gate structures 208a and 208b extend along a direction 1. In some embodiments, an area of the drain region 210 is greater than an area of the pair of source regions 206a and 206b. In some embodiments, the pair of gate structures 208a and 208b share the drain region 210. As mentioned above, the source region 206a, the drain region 210 and the source region 206b are alternately arranged along a direction 2 to form a multi-finger semiconductor ESD protection device 200a, as shown in FIG. 6. In some embodiments, the direction 1 and the direction 2 are perpendicular to each other.

The substrate 202 includes dopants of a first conductivity type, and the pair of source regions 206a and 206b and the drain region 210 include a second conductivity type. The first and second conductivity types are complementary to each other. In some embodiments, the first conductivity type is a p type, and the second conductivity type is an n type.

In some embodiments, well regions and/or other doped regions may be formed in the substrate 202, though not shown. The well regions and the doped regions can be formed adjacent to or under the source regions 206a and 206b and/or the drain region 210. The well regions and the doped regions may include dopants of the first conductivity type or the second conductivity type. It should be understood that conductivity type and arrangement of the well regions and the doped regions can be modified depending on different product designs.

The gate structure 208a is between the source region 206a and the drain region 210, and the gate structure 208b is between the source region 206b and the drain region 210. In some embodiments, widths of the gate structures 208a, 208b are between approximately 2 μm and approximately 40 μm, and a length of each gate structure 208a, 208b is between approximately 10 nm and approximately 1,000 nm, but the disclosure is not limited thereto. The pair of gate structures 208a and 208b include a gate dielectric layer 212, a gate conductive layer 214 and spacers (shown in FIG. 17). In some embodiments, the gate conductive layer 214 includes semiconductor material and the gate dielectric layer 212 includes an oxide, a nitride, or the like. In other embodiments, the gate conductive layer 214 includes metal materials such as work function metal and low-resistant metal. In such embodiments, the gate conductive layer 214 may be a multi-layered structure. Further, in such embodiments, the gate dielectric layer 212 includes high-k dielectric materials.

In some embodiments, the semiconductor ESD device 200a includes a dielectric layer 216 and a dielectric layer 218 (shown in FIG. 17) disposed over the substrate 202. In some embodiments, the dielectric layers 216 and 218 may be alternately arranged, as shown in FIG. 17, but the disclosure is not limited thereto. The dielectric layers 216 and 218 may include dielectric materials having different etching rates, but the disclosure is not limited thereto. In some embodiments, the dielectric layers 216 and 218 form a dielectric structure 220 over the substrate 202. As shown in FIG. 17, the dielectric structure 220 is disposed over the pair of source regions 206a and 206b, the pair of gate structures 208a and 208b and the drain region 210.

The semiconductor ESD protection device 200a further includes a plurality of conductive contacts 222, 224, and 226 disposed in the dielectric structure 220.

In some embodiments, the conductive contacts 222 are disposed on each of the pair of source regions 206a and 206b and arranged along the direction D1. Further, the conductive contacts 222 are electrically connected to the pair of source regions 206a and 206b. In some embodiments, the conductive contacts 224 are disposed on each of the pair of gate structures 208a and 208b. Further, the conductive contacts 224 are electrically connected to the gate structures 208a and 208b. In some embodiments, the conductive contacts 226 are disposed on the drain region 210 and electrically connected to the drain region 210. Further, the conductive contacts 226 are arranged along the direction 1 to form a column C2a and a column C2b, as shown in FIG. 6. In some embodiments, salicide structures 228 can be formed between the conductive contacts 222 and the source regions 206a, 206b, and between the conductive contacts 226 and the drain region 210, as shown in FIG. 17.

In some embodiments, the semiconductor ESD protection device 200a further includes a dummy structure 230 disposed over the drain region 210. In some embodiments, the dummy structure 230 has a strip configuration and is disposed between the column C2a and the column C2b formed by the conductive contacts 226. As shown in FIG. 17, the dummy structure 230 is disposed in the dielectric structure 220. Further, sidewalls and a top surface of the dummy structure 230 are in contact with the dielectric structure 220. In some embodiments, the dummy structure 230 can include a dielectric layer 236, a conductive layer 238 over the dielectric layer 236 and spacers over sidewalls of the conductive layer 238 and the dielectric layer 236. In some embodiments, the conductive layer 238 of the dummy structure 230 and the gate conductive layer 214 of the gate structures 208a and 208b include a same material, such as a metal material. In such embodiments, the dielectric layer 236 of the dummy structure 230 and the gate dielectric layer 212 of the gate structures 208a and 208b include a same material, such as a high-k dielectric material. In some alternative embodiments, the gate conductive layer 214 of the gate structures 208a and 208b includes metal materials, while the conductive layer 234 of the dummy structure 230 includes semiconductor materials. In such embodiments, the dielectric layer 232 of the dummy structure 230 and the gate dielectric layer 212 of the gate structures 208a and 208b may include different dielectric materials.

As mentioned above, the dummy structure 230 includes a strip configuration extending along the direction 1. In some embodiments, a width of the dummy structure 230 is between approximately 0.1 μm and approximately 40 μm. In some embodiments, a length of the dummy structure 230 is equal to or less than a length of the gate structures 208a and 208b. In some embodiments, the length of the dummy structure 230 is between approximately 5 nm and approximately 1,000 nm, but the disclosure is not limited thereto. In some embodiments, a distance D6a between the gate structure 208a and the dummy structure 230 is equal to a distance D6b between the gate structure 208b and the dummy structure 230. In some embodiments, the distances D6a and D6b are respectively between approximately 20 nm and approximately 8,000 nm, but the disclosure is not limited thereto.

Figure 7:
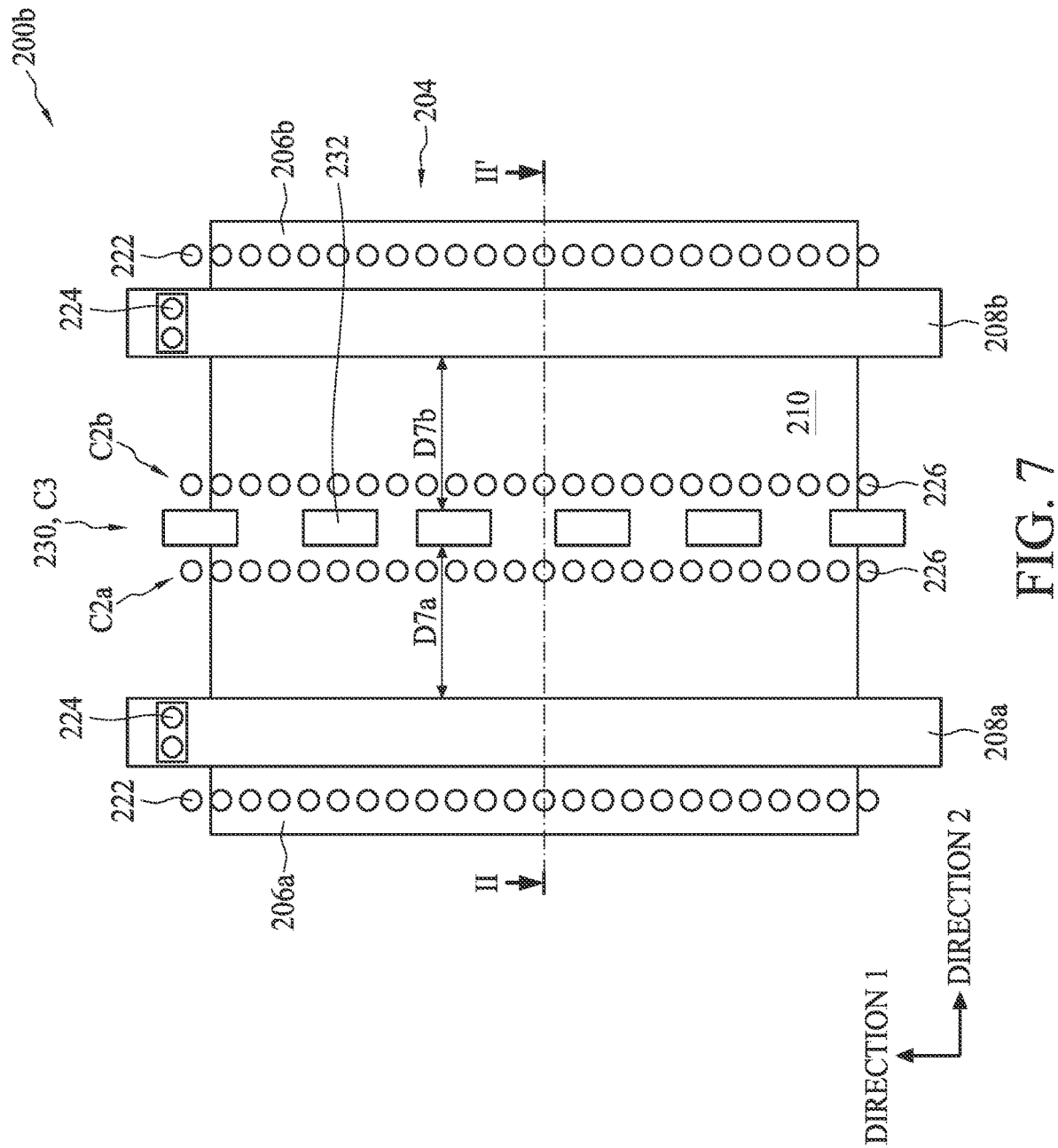
FIG. 7 shows an overhead layout diagram of a semiconductor ESD protection device in accordance with aspects of the present disclosure.

Please refer to FIG. 7, which is an overhead layout diagram of a semiconductor ESD protection device 200b in accordance with aspects of the present disclosure. It should be understood that same elements in FIGS. 6 and 7 are depicted by same numerals, and can include same materials, and thus repeated description may be omitted in the interest of brevity. In some embodiments, the dummy structure 230 includes a plurality of dummy islands 232. In some embodiments, a width of each dummy island 232 is between approximately 0.1 μm and approximately 40 μm, and a length of each dummy island 232 is between approximately 5 nm and approximately 1,000 nm, but the disclosure is not limited thereto. In some embodiments, each of the dummy islands 232 is disposed between the column C2a and the column C2b. In some embodiments, the dummy islands 232 are arranged to form a column C3 extending along the direction 1. In other words, the column C3 is disposed between the column C2a and the column C2b. In such embodiments, a distance D7a between the gate structure 208a and the column C3 is equal to a distance D7b between the gate structure 208b and the column C3. In some embodiments, the distances D7a and D7b are respectively between approximately 20 nm and approximately 8,000 nm, but the disclosure is not limited thereto. In some embodiments, a distance between adjacent dummy islands 232 measured along the direction 1 is between approximately 10 nm and approximately 5,000 nm, but the disclosure is not limited thereto.

Figure 8:
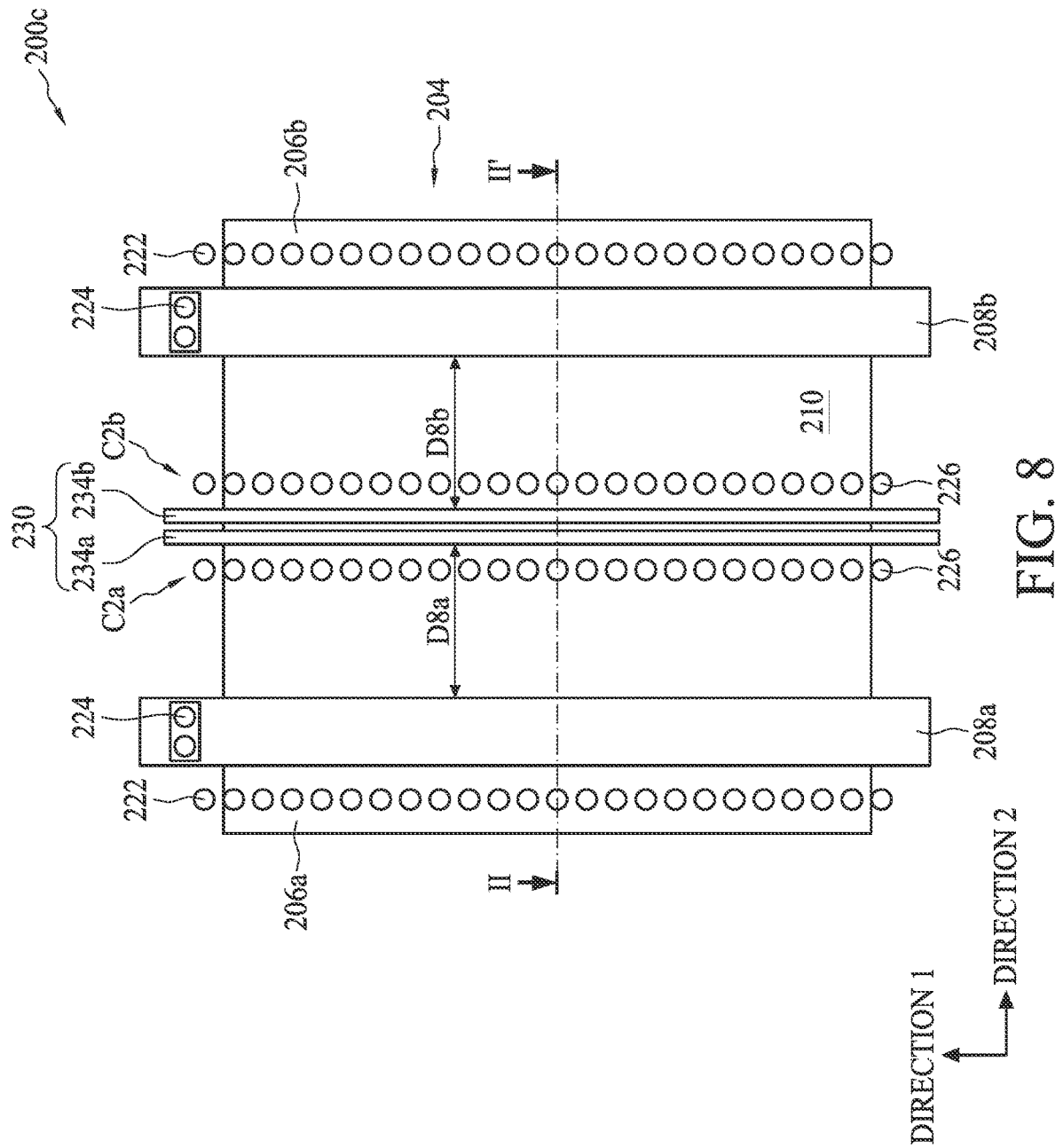
FIG. 8 shows an overhead layout diagram of a plurality of semiconductor ESD protection devices in accordance with aspects of the present disclosure.

Please refer to FIG. 8, which is an overhead layout diagram of a semiconductor ESD protection device 200c in accordance with aspects of the present disclosure. It should be understood that same elements in FIGS. 6 and 8 are depicted by same numerals, and can include same materials, and thus repeated description may be omitted in the interest of brevity. In some embodiments, the dummy structure 230 includes a plurality of dummy strips 234a and 234b along the direction 1. In some embodiments, a width of each dummy strip 234a, 234b is between approximately 0.1 μm and approximately 40 μm. In some embodiments, lengths of the dummy strips 234a, 234b are equal to or less than the lengths of the gate structures 208a and 208b. In some embodiments, the length of each dummy strip 234a, 234b is between approximately 5 nm and approximately 1,000 nm, but the disclosure is not limited thereto. In some embodiments, the plurality of dummy strips 234a and 234b are disposed between the column C2a and the column C2b. In such embodiments, a distance D8a between the gate structure 208a and the dummy strip 234a is equal to a distance D8b between the gate structure 208b and the dummy strip 234b.

Figure 9:
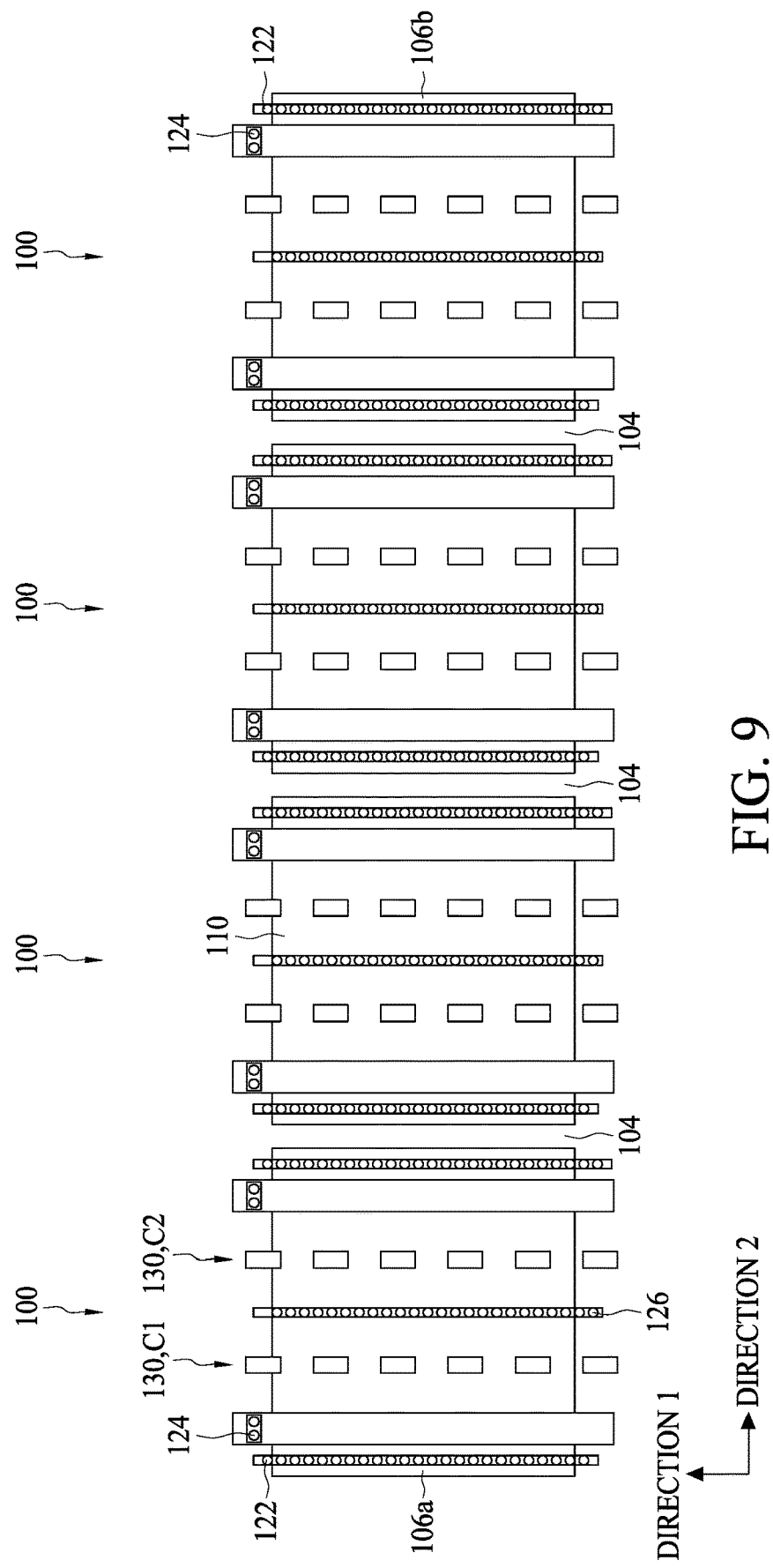
FIG. 9 shows an overhead layout diagram of a plurality of semiconductor ESD protection devices in accordance with aspects of the present disclosure.
Figure 10:
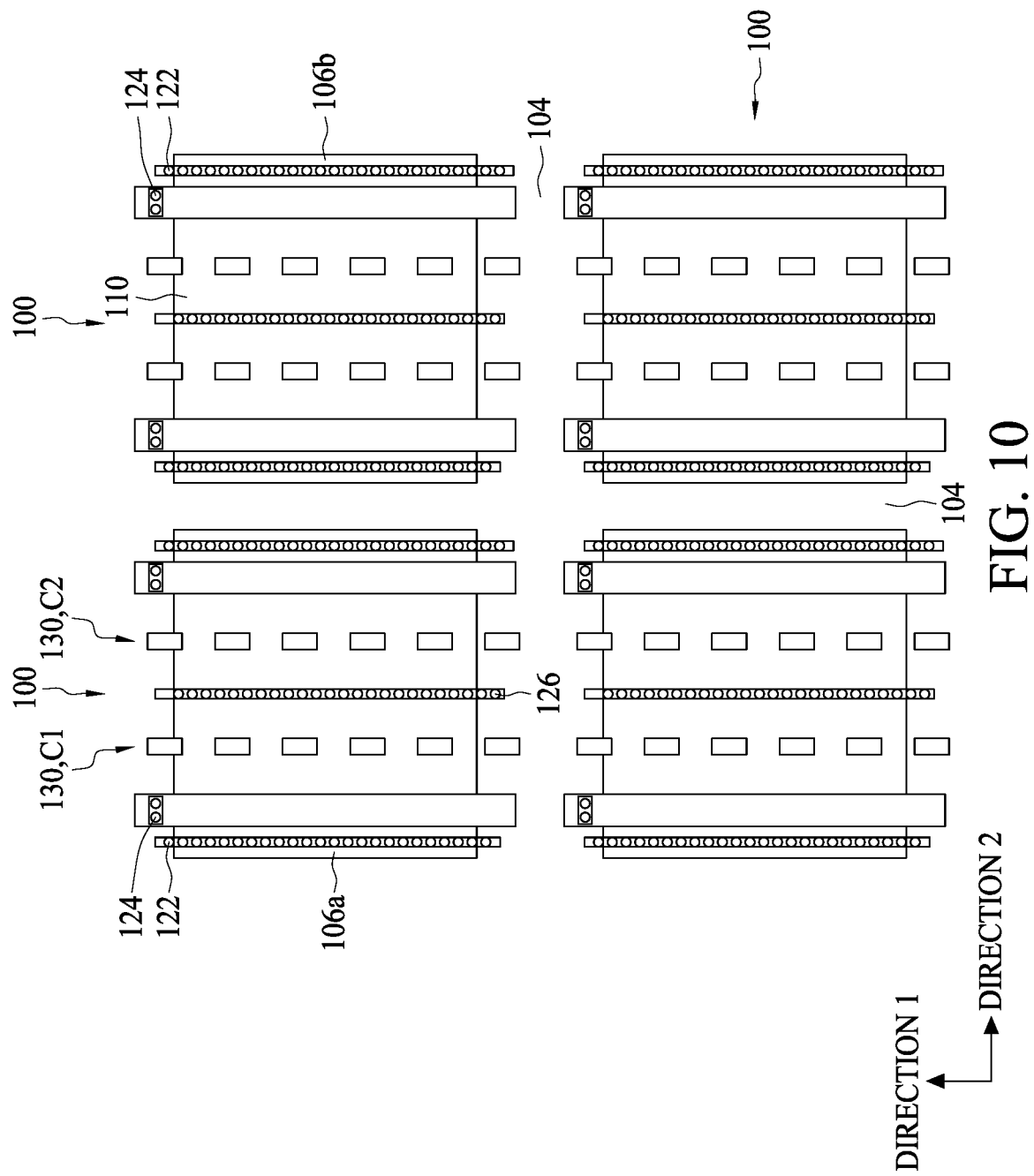
FIG. 10 shows an overhead layout diagram of a plurality of semiconductor ESD protection devices in accordance with aspects of the present disclosure.

Please refer to FIGS. 9 and 10, which respectively show an overhead layout diagram of a plurality of semiconductor ESD protection devices 100 in accordance with aspects of the present disclosure. In some embodiments, the semiconductor ESD protection device 100 can be arranged in a repeating configuration. The semiconductor ESD protection devices 100 can be the semiconductor ESD protection device 100a, 100b, 100c, 100d and/or 100e. Selection and adaption of the semiconductor ESD protection devices 100a to 100e can be modified according to various product designs.

As shown in FIG. 9, in some embodiments, the semiconductor ESD protection devices 100 are arranged to form a row. Further, the semiconductor ESD protection devices 100 in the row are electrically isolated from each other by the isolation structure 104.

As shown in FIG. 10, in some embodiments, the semiconductor ESD protection devices 100 are arranged to form a column-and-row array. Further, the semiconductor ESD protection devices 100 in the array are electrically isolated from each other by the isolation structure 104.

Figure 11:
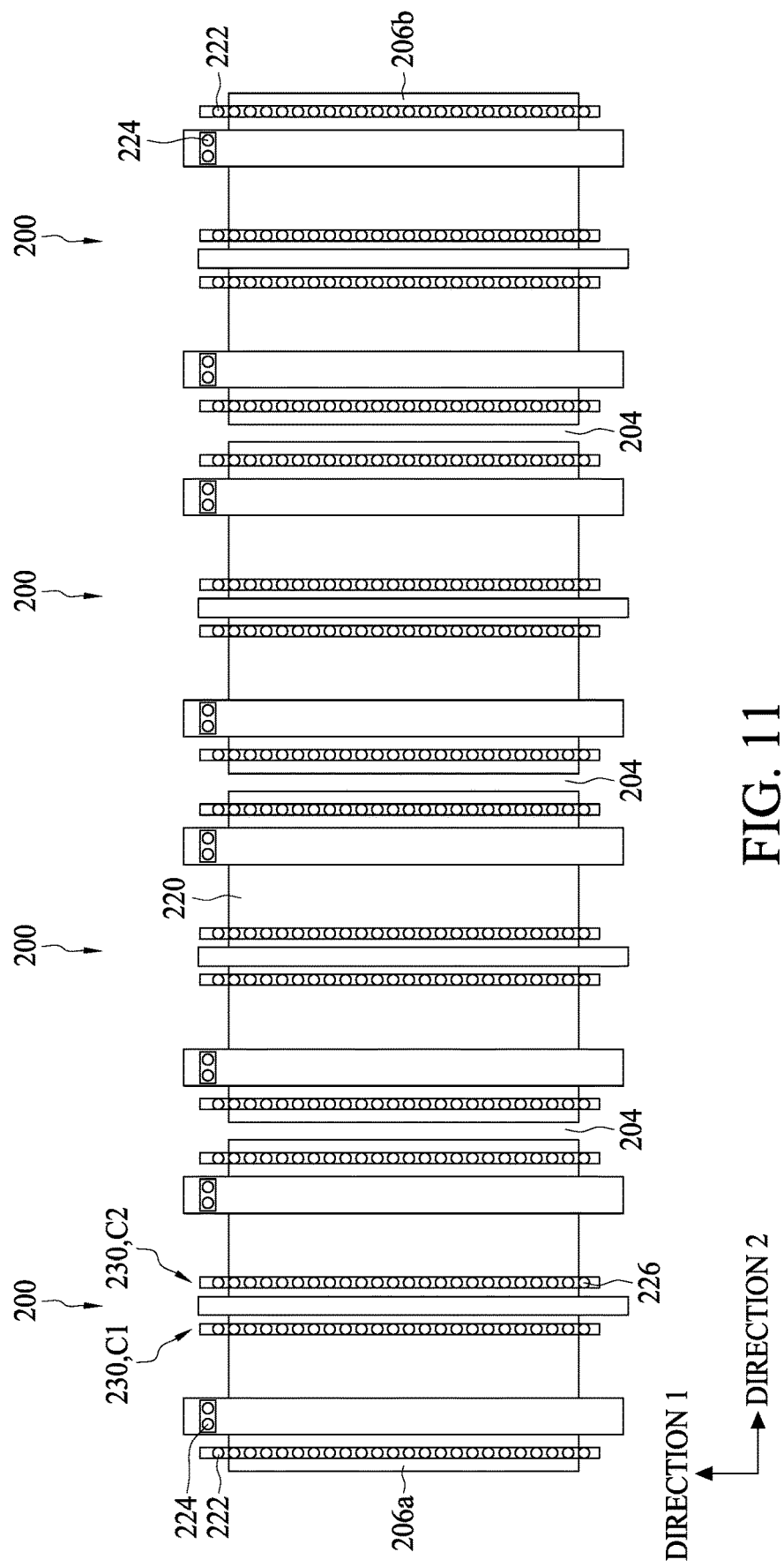
FIG. 11 shows an overhead layout diagram of a plurality of semiconductor ESD protection devices in accordance with aspects of the present disclosure.
Figure 12:
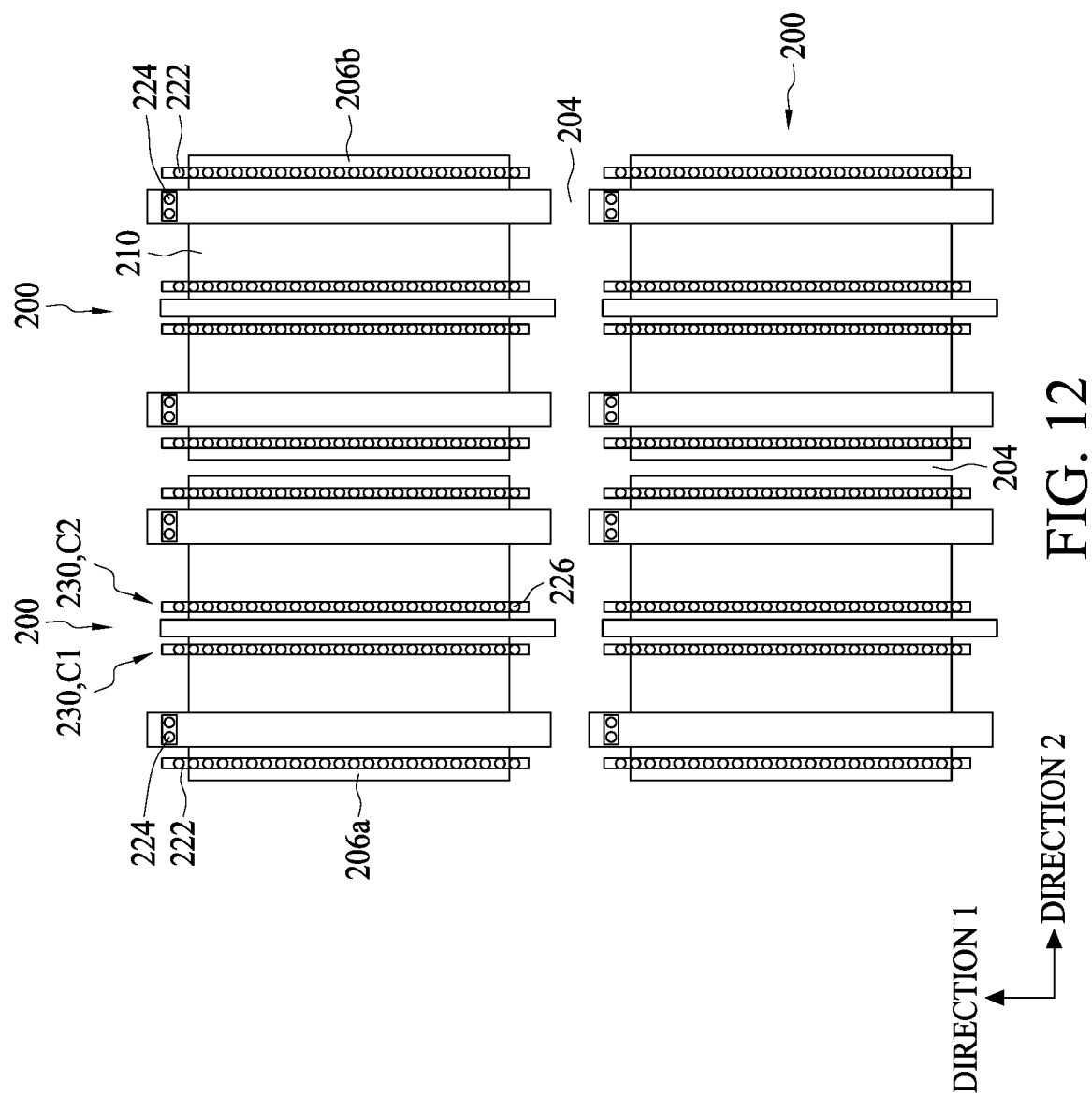
FIG. 12 shows an overhead layout diagram of a plurality of semiconductor ESD protection devices in accordance with aspects of the present disclosure.

Please refer to FIGS. 11 and 12, which respectively show an overhead layout diagram of a plurality of semiconductor ESD protection devices 200 in accordance with aspects of the present disclosure. In some embodiments, the semiconductor ESD protection device 200 can be repeatedly arranged. The semiconductor devices 100 can be 200a, 200b and/or 200c. Selection and adaption of the semiconductor ESD protection devices 200a to 200c can be modified according to various product designs.

As shown in FIG. 11, in some embodiments, the semiconductor ESD protection devices 200 are arranged to form a row. Further, the semiconductor ESD protection devices 200 in the row are electrically isolated from each other by the isolation structure 204.

As shown in FIG. 12, in some embodiments, the semiconductor ESD protection devices 200 are arranged to form a column-and-row array. Further, the semiconductor ESD protection devices 200 in the array are electrically isolated from each other by the isolation structure 204.

In other embodiments, the arrangements of the semiconductor ESD protection devices 100 and 200 can be modified depending on product designs.

Figure 14:
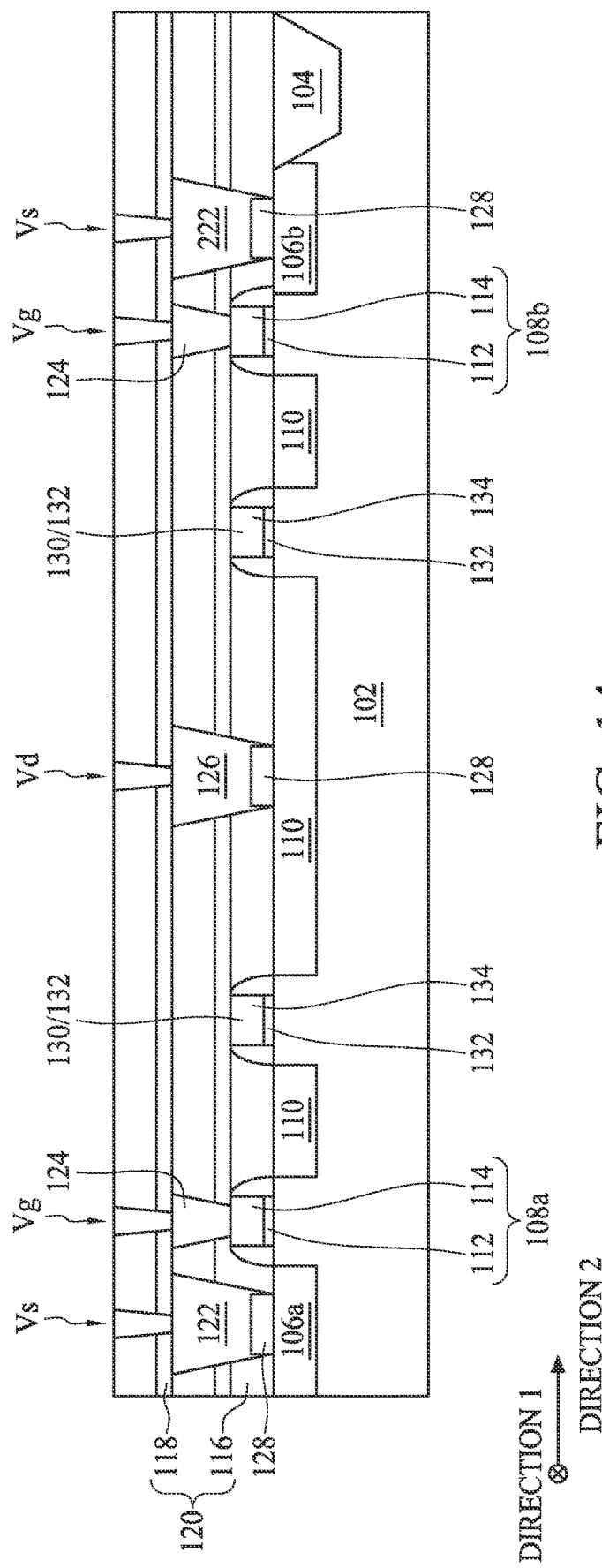
FIG. 14 is a cross-sectional view taken along lines I-I' of FIG. 1 according to aspects of the present disclosure.
Figure 15:
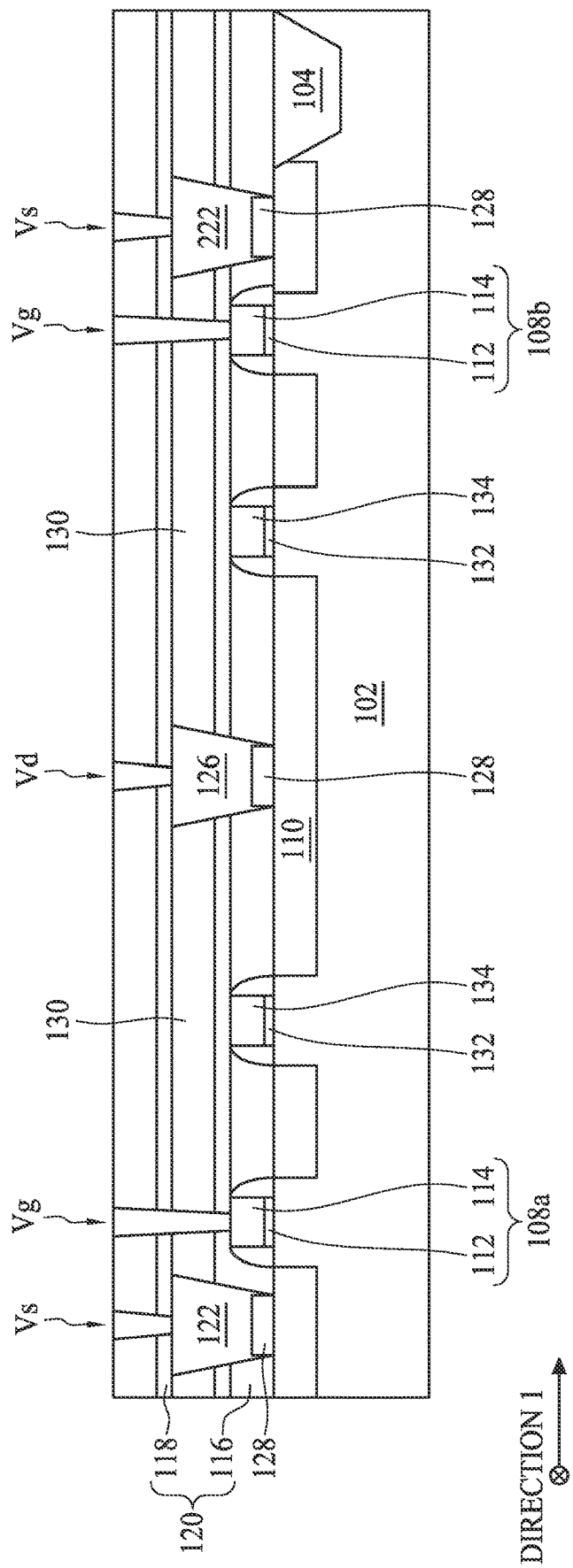
FIG. 15 is a cross-sectional view taken along lines I-I' of FIG. 1 according to aspects of the present disclosure.

Please refer to FIGS. 13 to 15, which are cross-sectional views taken along line I-I' of FIG. 1. It should be noted that although FIGS. 13 to 15 show the cross-sectional views of the semiconductor ESD protection device 100, those skilled in the art would understand that the semiconductor ESD protection devices 100b to 100e may include modifications according to the following description. In some embodiments, the dummy structure 130 is disposed over the drain region 110, as shown in FIG. 13. In other embodiments, the drain region 110 may be interrupted by the dummy structure 130, as shown in FIG. 14.

In some embodiments, the semiconductor ESD protection device 100a may include other elements. For example, the semiconductor ESD protection device 100a may include a plurality of via plugs Vs, Vg, and Vd disposed in the dielectric structure 120. The via plugs Vs, Vg and Vd may be coupled to the conductive contacts 122, 124 and 126, respectively, as shown in FIG. 13. The via plugs Vs are electrically connected to the source regions 106a and 106b through the conductive contacts 122, the via plugs Vg are electrically connected to the gate structures 108a and 108b through the conductive contacts 124, and the via plug Vd is electrically connected to the drain region 110 through the conductive contact 126. The via plugs Vs, Vg and Vd may be formed by back-end-of-line (BEOL) operations and may be used to electrically connect an underneath device to a BEOL interconnect structure. However, the dummy structure 130 is electrically isolated from the via plugs Vs, Vg and Vd and from the BEOL interconnect structure by the dielectric structure 120.

Referring to FIG. 15, in some embodiments, the gate structures 108a and 108b are coupled to the via plugs Vg I the absence of conductive contacts therebetween.

Figure 16:
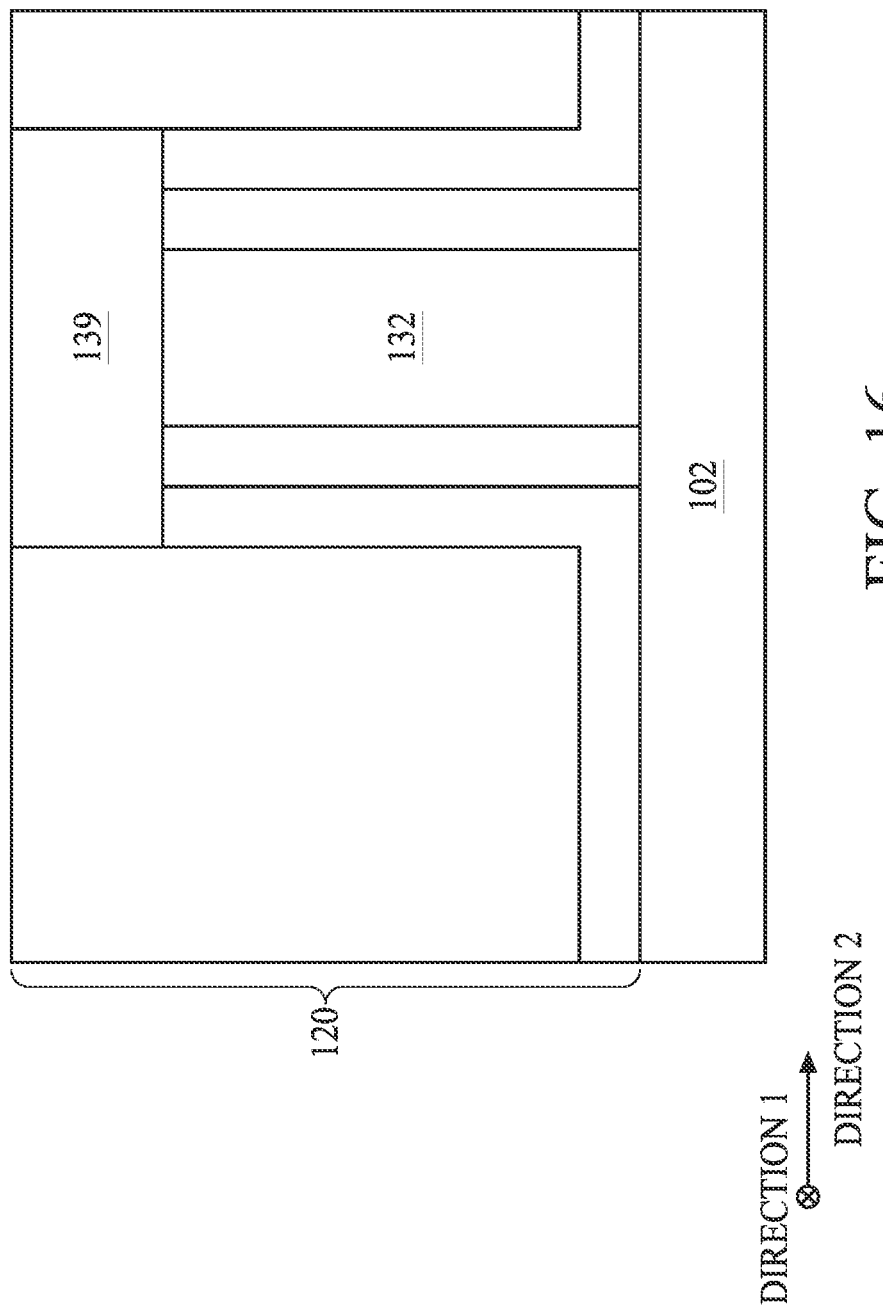
FIG. 16 is a cross-sectional view of a gate structure of the semiconductor ESD protection device according to aspects of the present disclosure.

Please refer to FIG. 16, which is a cross-sectional view of a gate structure of the semiconductor ESD protection device according to aspects of the present disclosure. In some embodiments, the pair of gate structures 108a and 108b include a self-aligned contact (SAC) layer or a sacrificial (SAC) layer 139 disposed thereon. The SAC layer 139 is used for forming the conductive contacts 122 and 124 that are closer to the gate structures 108a and 108b. Typically, the SAC layer 139 is fabricated by patterning the dielectric structure 120 on a top of the gate structures 108a and 108b. The SAC layer 139 is formed by a dielectric filling and planarization after metal gate is etched back. The SAC layer 139 on the top of gate, typically including nitride, creates a good etching selectivity compared to the dielectric of the dielectric structure 120. This facilitates a selective etching process that improves the process window of the forming of the conductive contacts 122 and 126. As device density increases (i.e., dimensions of semiconductor devices decreases), a thickness of the sidewall spacer becomes thinner, which may cause a short circuit between the conductive contacts 122 and 126 and the gate conductive layer 132.

Figure 18:
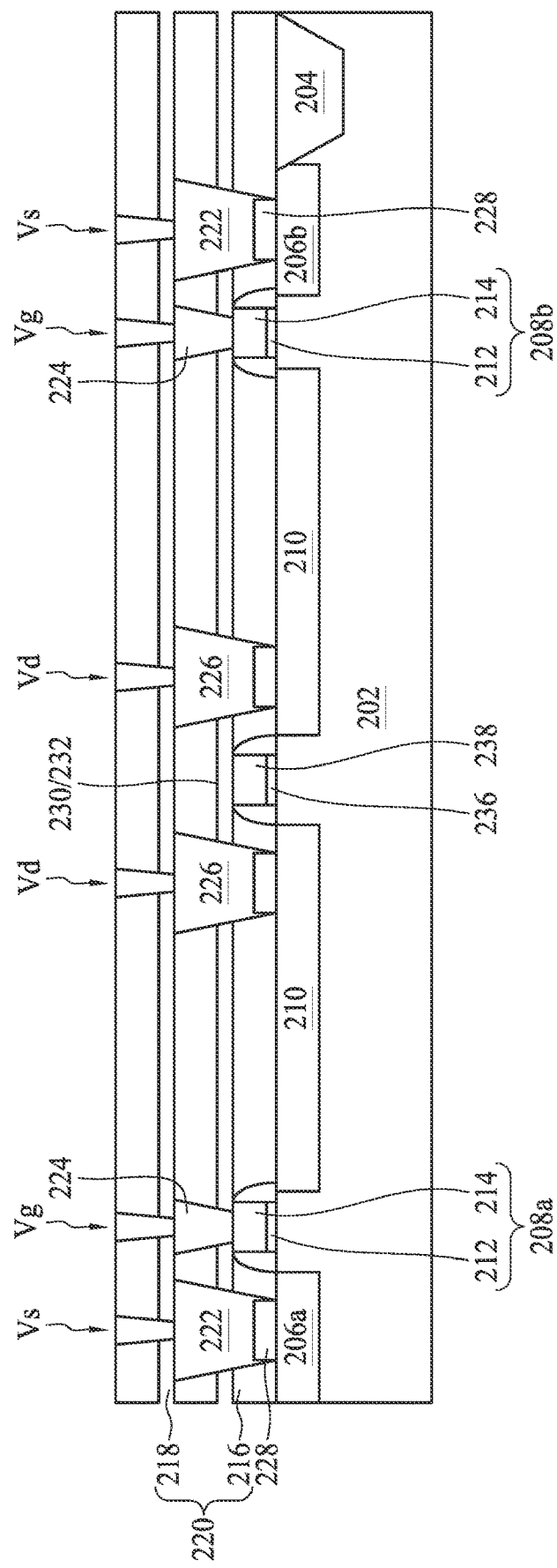
FIG. 18 is a cross-sectional view taken along lines II-II' of FIG. 2 according to aspects of the present disclosure.
Figure 19:
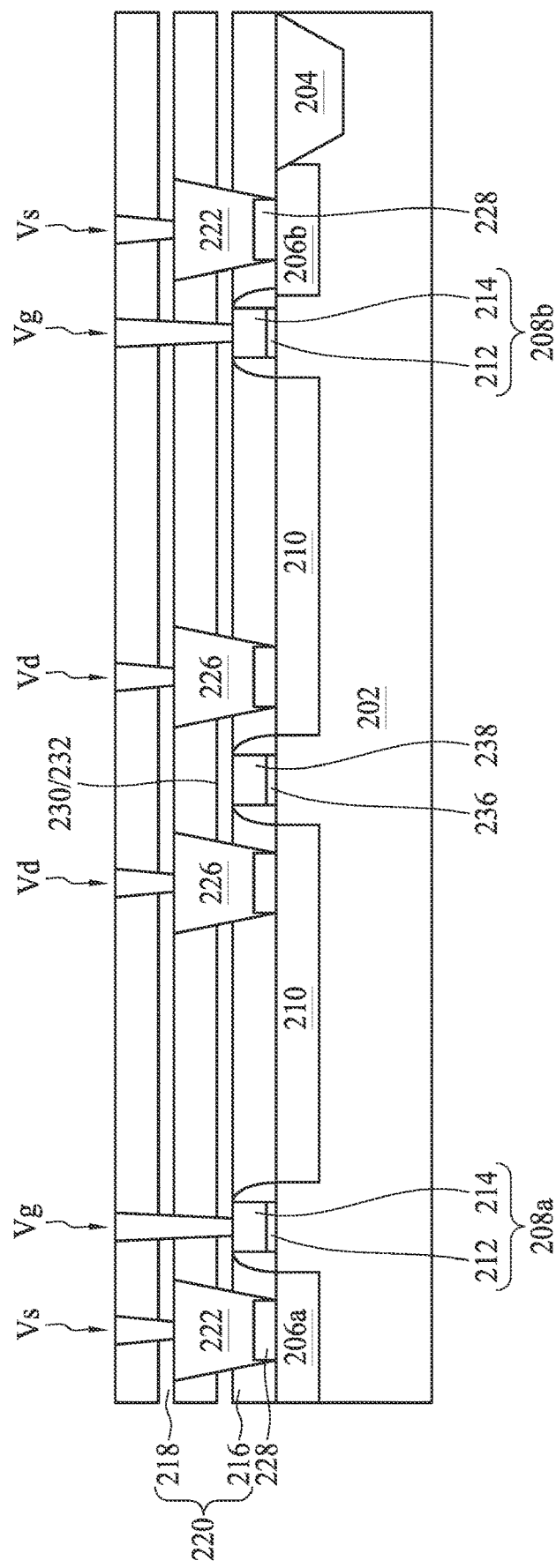
FIG. 19 is a cross-sectional view taken along lines II-II' of FIG. 2 according to aspects of the present disclosure.

Please refer to FIGS. 17 to 19, which are cross-sectional views taken along line II-II' of FIG. 6. It should be noted that although FIGS. 17 to 19 show the cross-sectional views of the semiconductor ESD protection devices 200a, those skilled in the art would understand that the semiconductor ESD protection devices 200b and 200c may include modifications according to the following description. In some embodiments, the dummy structure 230 is disposed over the drain region 210, as shown in FIG. 17. In other embodiments, the drain region 210 may be interrupted by the dummy structure 230, as shown in FIG. 18.

In some embodiments, the semiconductor ESD protection device 200a may include other elements. For example, the semiconductor ESD protection device 200a may include a plurality of via plugs Vs, Vg and Vd disposed in the dielectric structure 220. The via plugs Vs, Vg and Vd may be coupled to the conductive contacts 222, 224 and 226, respectively, as shown in FIG. 17. Accordingly, the via plugs Vs are electrically connected to the source regions 206a and 206b through the conductive contacts 222, the via plugs Vg are electrically connected to the gate structures 208a and 208b through the conductive contacts 224, and the via plug Vd is electrically connected to the drain region 110 through the conductive contact 226. The via plugs Vs, Vg and Vd may be formed by BEOL operations and may be used to electrically connect an underneath device to a BEOL interconnect structure. However, the dummy structure 230 is electrically isolated from the via plugs Vs, Vg and Vd and from the BEOL interconnect structure by the dielectric structure 220.

Referring to FIG. 19, in some embodiments, the gate structures 208a and 208b are coupled to the via plugs Vg in the absence of conductive contacts.

In some embodiments, the pair of gate structures 208a and 208b include a SAC layer 139 disposed thereon. The gate structures 208a and 208b may be similar to the gate structures 108a and 108b as shown in FIG. 16; therefore, repeated details are omitted for brevity.

Figure 20:
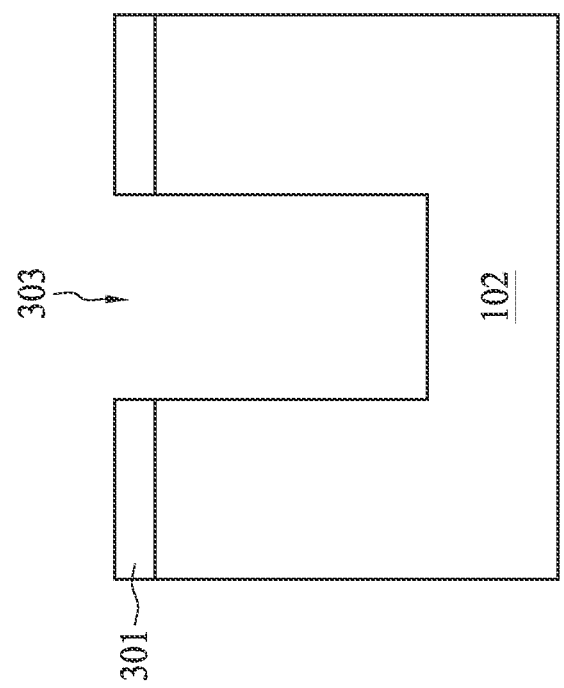
Figure 24:
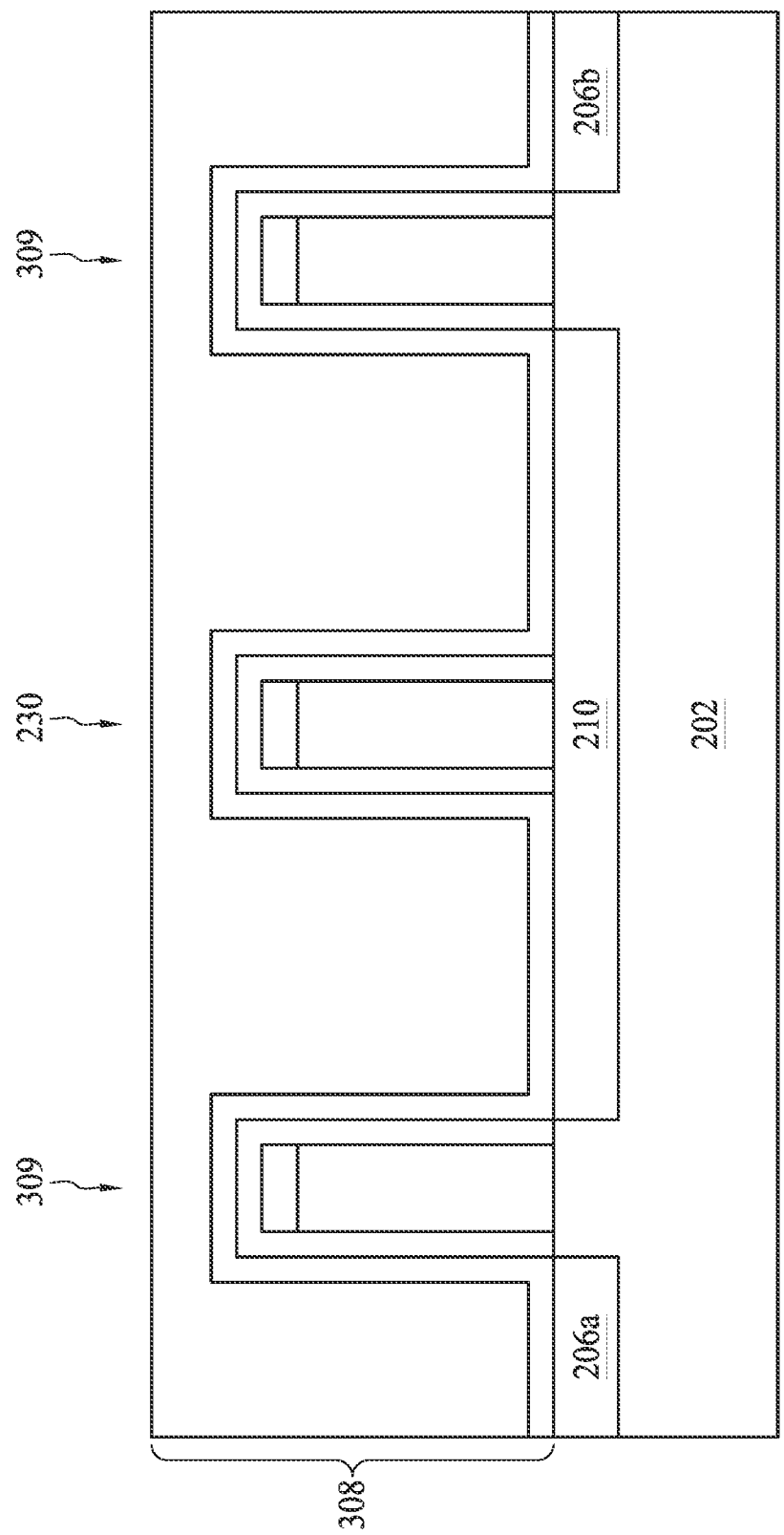

A ratio of the isolation structures 104 and 204 to the active regions helps to mitigate a dishing issue during forming the semiconductor ESD protection devices. Please refer to FIGS. 20 to 23A and 23B, which are schematic drawings illustrating various stages for forming a semiconductor ESD protection device according to aspects of the present disclosure. In some embodiments, a substrate 102 may be provided or received for forming the semiconductor ESD protection device 100a. It should be noted that similar operations are also performed to form the semiconductor ESD protection devices 100b to 100e and 200a to 200c; therefore, repeated descriptions are omitted. The isolation structure 104 may be formed in the substrate 102 and may be used to define a plurality of active regions. The forming of the isolation structure 104 includes further operations. In some embodiments, a patterned hard mask 301 is formed over the substrate 102. The patterned hard mask 301 defines locations, areas and arrangement of the active regions. In some embodiments, an area of the patterned hard mask 301 is equal to an area of the active region. Thereafter, an etch operation is performed on the substrate 102 to remove unmasked portions of the substrate 102. Consequently, a trench 303 is formed in the substrate 102, as shown in FIG. 20.

Figure 21:
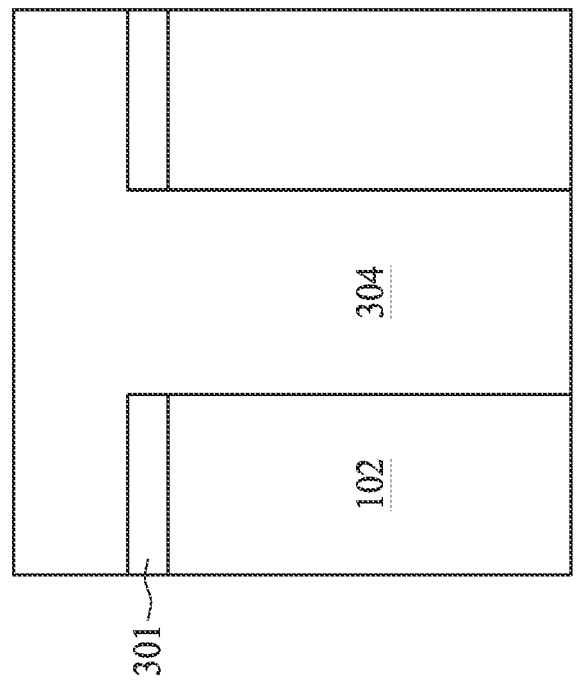

A dielectric material 304 may be formed to fill the trench 303, as shown in FIG. 21. Further, the dielectric material 304 may cover a top surface of the patterned hard mask 301. In some embodiments, the dielectric material 304 may include silicon oxide.

Referring to FIG. 22A, a planarization (e.g., a CMP) is performed on the dielectric material 304 to form the isolation structure 104. In some embodiments, portions of the dielectric material 304 over the patterned hard mask 301 are removed, such that a top surface of the isolation structure 104 is aligned (i.e., coplanar) with the top surface of the patterned hard mask 301. It should be noted that active regions 306a and 306b are defined and surrounded by the isolation structures 104/204. Further, the active region 306a is physically and electrically separated from the active region 306b by the isolation structure 104. A size of the active regions 306a and 306b is respectively less than 1000 μm².

Please refer to FIG. 22B, which is a comparison to FIG. 22A. In such comparison, active regions 306a' and 306b' are defined by the isolation structure 104', which is formed by operations same as those of the forming of the isolation structure 104. However, a size of the active regions 306a' and 306b' is respectively greater than 1000 μm. It is observed that a ratio of an area of the patterned hard mask 301 to an area of the isolation structure 104 is less than a ratio of an area of the patterned hard mask 301' to an area of the isolation structure 104'. It is found that during the CMP, a downforce is reduced as soon as the patterned hard masks 301 and 301' are exposed. Accordingly, removal rates of the dielectric materials 304 and 304' over the patterned hard masks 301 and 301' are reduced. Due to the grater ratio, the removal rate of the dielectric material 304' over the patterned hard mask 301' is reduced even more than the removal rate of the dielectric material 304 over the patterned hard mask 301; therefore, portions of the dielectric material 304' may remain on a top surface of the patterned hard mask 301'. Thus, the dishing issue arises, as shown in FIG. 22B.

Please refer to FIGS. 23A and 23B, wherein FIG. 23B is a comparison of FIG. 23A. In some embodiments, the patterned hard mask 301 is removed after the forming of the isolation structure 104. In such embodiments, an etch operation is performed on the patterned hard mask 301. The etch operation uses etchants having selectivity on the materials of the patterned hard mask 301 and the materials of the isolation structure 104. Therefore, consumption of the isolation structure 104 is negligible. Referring to FIG. 23B, in the comparison, the dielectric material 304' remaining on the patterned hard mask 301' obstructs the removal of the patterned hard mask 301'. Thus, oxide and nitride residue is left to cause other issues during subsequent operations. Accordingly, it is concluded that a suitable ratio of the area of the isolation structures 104 to an area of the active regions helps to mitigate the dishing issue and residue issue when forming the semiconductor ESD protection devices.

FIGS. 24, 25A, 26A, 27A and 28A are schematic drawings illustrating various stages for forming a semiconductor ESD protection device according to aspects of the present disclosure. In some embodiments, after the forming of the isolation structure 204, further operations are performed to form the semiconductor ESD protection device 200a. It should be noted that such operations are also performed to form the semiconductor ESD protection devices 100a to 100e, 200b and 200c; therefore, repeated descriptions are omitted.

In some embodiments, a pair of sacrificial gates 309 are formed over the substrate 202, and a dummy structure 230 is formed over the substrate 202. The sacrificial gates 309 and the dummy structure 230 may be formed by same operations and may include same materials. For example, a dielectric layer and a semiconductor layer are sequentially formed over the substrate 202 and patterned to form the sacrificial gates 309 and the dummy structure 230. Thus, the sacrificial gates 309 and the dummy structure 230 include the same dielectric layer and the same semiconductor layer. Source regions 206a and 206b and a drain region 210 are formed in the substrate 202. A dielectric structure 308 is formed over the substrate 202, wherein the sacrificial gates 309 and the dummy structure 230 are embedded in the dielectric structure 308. In some embodiments, the dielectric structure 308 is a portion of dielectric structure 220. In some embodiments, the dielectric structure 308 may be a multi-layered structure. In such embodiments, the dielectric structure 308 may include a contact etch stop layer (CESL) and an ILD layer, but the disclosure is not limited thereto.

Figure 25A:
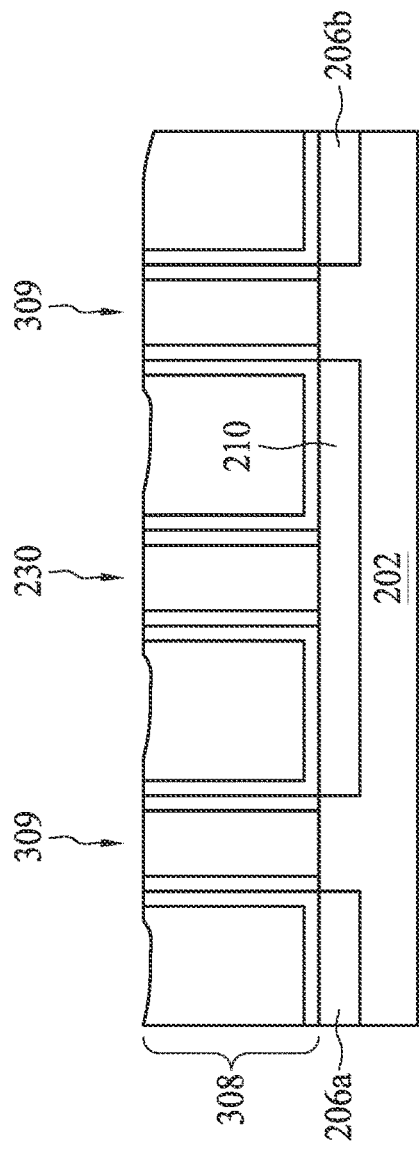

Referring to FIG. 25A, a planarization (i.e., a CMP) is performed to remove portions of the dielectric structure 308 to expose top surfaces of the semiconductor layers of the sacrificial gates 309 and the dummy structure 230. In some embodiments, the dummy structure 230 disposed between the pair of sacrificial gates 309 provides mechanical support, thus mitigating the dishing issue between the sacrificial gates 309.

Figure 25B:
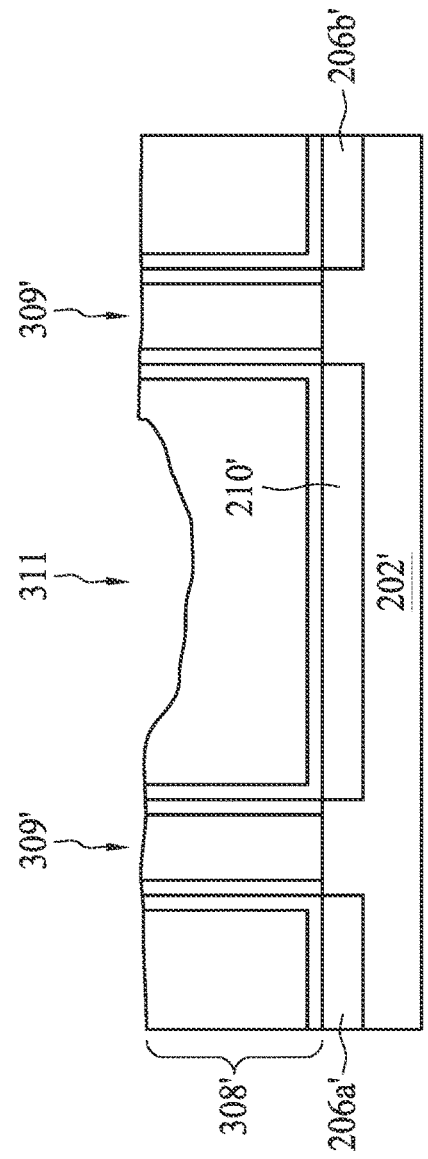

Referring to FIG. 25B, in comparison, when there is no dummy structure 230 disposed between the pair of sacrificial gates 309', the dishing issue arises because no mechanical support is provided. As shown in FIG. 25B, a recess 311 may be formed in the dielectric structure 308' between the sacrificial gates 309'.

Referring to FIGS. 26A and 26B, in some embodiments, the semiconductor layers of the sacrificial gates 309 and 309' and the semiconductor layer of the dummy structure 230 are removed. Consequently, a plurality of gate trenches 313, 313' and 235 are formed.

Figure 27A:
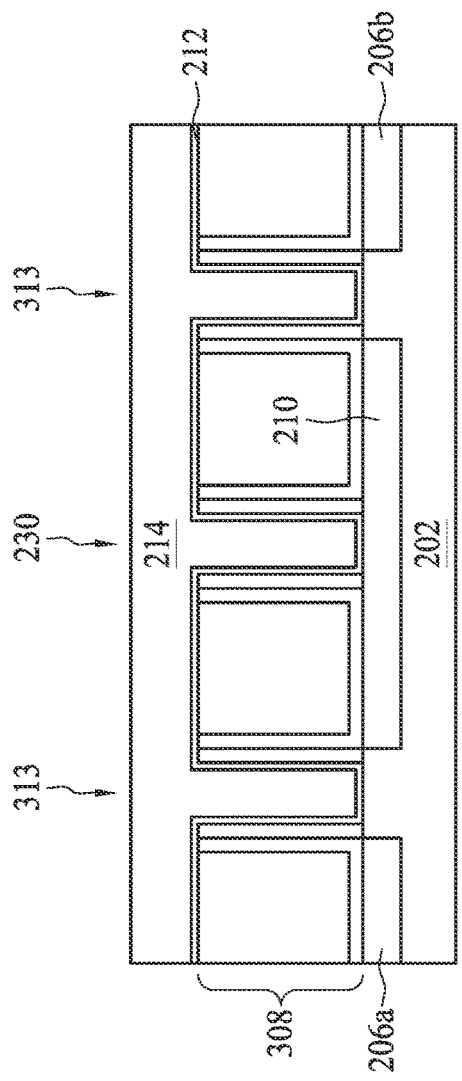
Figure 27B:
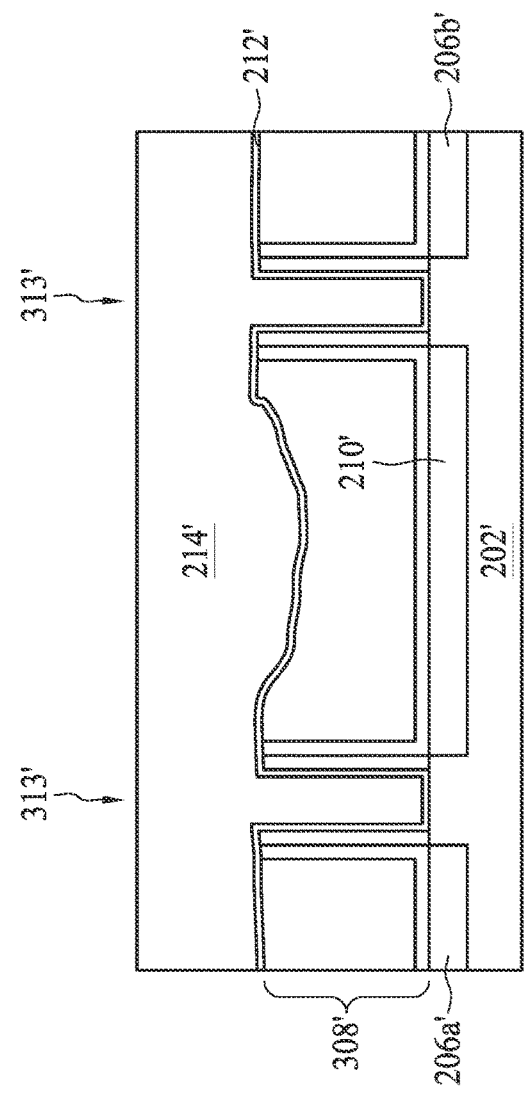

Referring to FIGS. 27A and 27B, a high-k gate dielectric layer 212 is formed to cover bottoms and sidewalls of the gate trenches 313 and 235, and a high-k gate dielectric layer 212' is formed to cover a bottom and sidewalls of the gate trenches 313'. Subsequently, a conductive layer 214 is formed to fill the gate trenches 313 and 235, and a conductive layer 214' is formed to fill the gate trenches 313'. The conductive layers 214 and 214' include metal materials. Further, the conductive layers 214 and 214' may be a multilayered structure, respectively, though not shown.

Referring to FIGS. 28A and 28B, in some embodiments, a planarization (i.e., a CMP) is performed to remove superfluous materials, and to expose a top surface of the dielectric structure 306. Accordingly, a pair of gate structures 208a and 208b and a dummy structure 230 are obtained. As shown in FIG. 28A, the gate structures 208a and 208b and the dummy structure 230 include the same dielectric layer 212 and the same conductive layer 214. Further, top surfaces of the conductive layers 214 of the gate structures 208a and 208b and the dummy structure 230 are aligned with the exposed top surface of the dielectric structure 308. In comparison, during forming the pair of gate structures 208a' and 208b', when there is no dummy structure disposed between the sacrificial gates 309', the recess 311 is formed. The high-k dielectric layer 212' and the conductive layer 214' may be formed in the recess 311. As shown in FIG. 28B, a residue 314 is left after the planarization. In the comparison, the residue 314 may cause other defects during subsequent operations.

According to one embodiment of the present disclosure, a semiconductor ESD protection device that is able to mitigate a dishing issue is provided. In some embodiments, the semiconductor ESD protection device includes one or more dummy structures over a drain. The dummy structure helps to provide mechanical strength during planarization, thereby mitigating the dishing issue.

According to one embodiment of the present disclosure, a semiconductor ESD protection device is provided. The semiconductor ESD protection device includes a pair of source regions, a pair of gate structures, a drain region, a plurality of first conductive contacts, a plurality of second conductive contacts, a plurality of third conductive contacts, and a dummy structure. The pair of gate structures are disposed between the pair of source regions and extend along a direction. The drain region is disposed between the pair of gate structures. Each of the first conductive contacts is disposed on one of the pair of source regions, and the plurality of first conductive contacts are arranged along the direction. Each of the plurality of second conductive contacts is disposed on one of the pair of gate structures. The plurality of third conductive contacts are disposed on the drain region and are arranged along the direction. The dummy structure is disposed over the drain region and between the pair of gate structures and between the plurality of third conductive contacts.

According to one embodiment of the present disclosure, a semiconductor ESD protection device is provided. The semiconductor ESD protection device includes a pair of source regions, a pair of gate structures, a drain region, a plurality of first conductive contacts, a plurality of second conductive contacts, a plurality of third conductive contacts, and a dummy structure. The pair of gate structures are disposed between the pair of source regions and extend along a direction. The drain region is disposed between the pair of gate structures. Each of the plurality of first conductive contacts is disposed on one of source regions and are arranged along the direction. Each of the plurality of second conductive contacts is disposed on one of the pair of gate structures. The plurality of third conductive contacts are disposed on the drain region and arranged along the direction to form a first column and a second column. The dummy structure is disposed between the first column and the second column.

According to one embodiment of the present disclosure, a semiconductor ESD protection device is provided. The semiconductor ESD protection device includes a substrate, a pair of source regions, a pair of gate structures, a drain region, a dielectric structure, a pair of first conductive contacts, a pair of second conductive contacts, a plurality of third conductive contacts, and a dummy structure. The pair of source regions are disposed in the substrate. The pair of gate structures are disposed over the substrate and between the pair of source regions. The drain region is disposed in the substrate and between the pair of gate structures. The dielectric structure is disposed over the substrate. The pair of first conductive contacts are disposed on the pair of source regions and in the dielectric structure. The pair of second conductive contacts are disposed on the pair of gate structures and in the dielectric structure. The plurality of third conductive contacts ares disposed on the drain region and in the dielectric structure. The dummy structure is disposed on the drain region and between the pair of gate structures. A top surface and sidewalls of the dummy structure are in contact with the dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor ESD protection device comprising:
a pair of source regions;
a pair of gate structures disposed between the pair of source regions and extending along a direction;
a drain region disposed between the pair of gate structures;
a plurality of first conductive contacts disposed on the source regions and arranged along the direction;
a plurality of second conductive contacts disposed on the gate structures;
a plurality of third conductive contacts disposed on the drain region and arranged along the direction; and
a dummy structure disposed over the drain region and between the gate structures and between the third conductive contacts.

2. The semiconductor ESD protection device of claim 1, further comprising a dielectric structure disposed over the pair of source regions, the pair of gate structures and the drain region, wherein sidewalls and a top surface of the dummy structure are in contact with the dielectric structure.

3. The semiconductor ESD protection device of claim 1, wherein the dummy structure comprises a plurality of dummy islands.

4. The semiconductor ESD protection device of claim 3, wherein the dummy islands are arranged to form a column extending along the direction.

5. The semiconductor ESD protection device of claim 3, wherein the dummy islands are arranged to form a column-and-row array.

6. The semiconductor ESD protection device of claim 3, wherein the dummy islands are arranged to form a staggered array.

7. The semiconductor ESD protection device of claim 1, wherein the dummy structure comprises a dummy strip extending along the direction.

8. The semiconductor ESD protection device of claim 1, wherein the dummy structure comprises a plurality of dummy strips extending along the direction.

9. The semiconductor ESD protection device of claim 1, further comprising an isolation structure surrounding the pair of source regions, the pair of gate structures and the drain region.

10. A semiconductor ESD protection device comprising:
a pair of source regions;
a pair of gate structures disposed between the pair of source regions and extending along a direction;
a drain region disposed between the pair of gate structures;
a plurality of first conductive contacts disposed on the source regions and arranged along the direction;
a plurality of second conductive contacts disposed on the gate structures;
a plurality of third conductive contacts disposed on the drain region and arranged along the direction to form a first column and a second column; and
a dummy structure disposed between the first column and the second column.

11. The semiconductor ESD protection device of claim 10, further comprising a dielectric structure disposed over the pair of source regions, the pair of gate structures and the drain region, wherein sidewalls and a top surface of the dummy structure are in contact with the dielectric structure.

12. The semiconductor ESD protection device of claim 10, wherein the dummy structure comprises a plurality of dummy islands arranged to form a third column extending the direction.

13. The semiconductor ESD protection device of claim 10, wherein the dummy structure comprises a dummy strip extending along the direction.

14. The semiconductor ESD protection device of claim 10, wherein the dummy structure comprises a plurality of dummy strips extending along the direction.

15. The semiconductor ESD protection device of claim 10, further comprising an isolation structure surrounding the pair of source regions, the pair of gate structures and the drain region.

16. A semiconductor ESD protection device comprising:
a substrate;
a pair of source regions disposed in the substrate;
a pair of gate structures disposed over the substrate and between the pair of source regions;
a drain region disposed in the substrate and between the pair of gate structures;
a dielectric structure disposed over the substrate;
a pair of first conductive contacts disposed on the source regions and in the dielectric structure;
a pair of second conductive contacts disposed on the gate structures and in the dielectric structure;
a plurality of third conductive contacts disposed on the drain region and in the dielectric structure; and
a dummy structure disposed on the drain region and between the pair of gate structures, wherein a top surface and sidewalls of the dummy structure are in contact with the dielectric structure.

17. The semiconductor ESD protection device of claim 16, wherein the dummy structure comprises a pair of dummy islands, and the plurality of third conductive contacts are disposed between the pair of dummy islands.

18. The semiconductor ESD protection device of claim 16, wherein the dummy structure is disposed between two adjacent third conductive contacts.

19. The semiconductor ESD protection device of claim 16, wherein the dummy structure and the pair of gate structures comprise metal materials.

20. The semiconductor ESD protection device of claim 16, wherein the dummy structure comprises semiconductor materials and the pair of gate structures comprise metal materials.

* * * * *